United States Patent [19]

Rauscher et al.

[11] Patent Number: 4,724,390

[45] Date of Patent: Feb. 9, 1988

[54] NON-SUPERCONDUCTING APPARATUS FOR DETECTING MAGNETIC AND ELECTROMAGNETIC FIELDS

[76] Inventors: Elizabeth A. Rauscher; William L. Van Bise, both of 64 Santa Margarita, San Leandro, Calif. 94579

[21] Appl. No.: 843,042

[22] Filed: Mar. 24, 1986

[51] Int. Cl.$^4$ ............... G01V 3/40; G01V 3/12; G01R 33/02

[52] U.S. Cl. .................... 324/344; 324/72; 324/258; 324/345; 340/601

[58] Field of Search .......... 324/72, 244, 258, 323, 324/330–332, 334–336, 344, 345; 340/600, 601; 73/170 R

[56] References Cited

U.S. PATENT DOCUMENTS

| | | | |
|---|---|---|---|
| 3,422,345 | 1/1969 | Muse | 324/350 |
| 3,546,580 | 12/1970 | Williams | 324/344 X |
| 3,662,260 | 5/1972 | Thomas et al. | 324/72 |
| 3,911,435 | 10/1975 | Mardon et al. | 324/344 X |
| 4,006,410 | 2/1977 | Roberts | 324/72 X |
| 4,198,596 | 4/1980 | Waeselynck et al. | 324/344 |
| 4,219,804 | 8/1980 | Weischedel | 340/601 X |
| 4,229,697 | 10/1980 | Petrosky et al. | 324/345 X |
| 4,277,744 | 7/1981 | Audone et al. | 324/72 |
| 4,395,906 | 8/1983 | Ryan et al. | 324/72 X |

*Primary Examiner*—Gerard R. Strecker
*Attorney, Agent, or Firm*—Thomas I. Rozsa

[57] ABSTRACT

The present invention relates to an apparatus for detecting magnetic and electromagnetic waves or fields through use of non-superconducting materials. The present invention relates to apparatus which are used to measure such fields in order to predict earthquakes, volcanic eruptions and other violent earth movements which generate substantial abberations in magnetic and electromagnetic fields. The present invention can be used to detect any fluctuating magnetic or electromagnetic fields regardless of their origin. The present invention incorporates the use of antennae for the electromagnetic components and coils to detect magnetic fields, in conjunction with electronic elements involving amplification, smoothing elements, frequency response networks, networks to make frequency response uniform within the band and notch filters where necessary.

12 Claims, 13 Drawing Figures

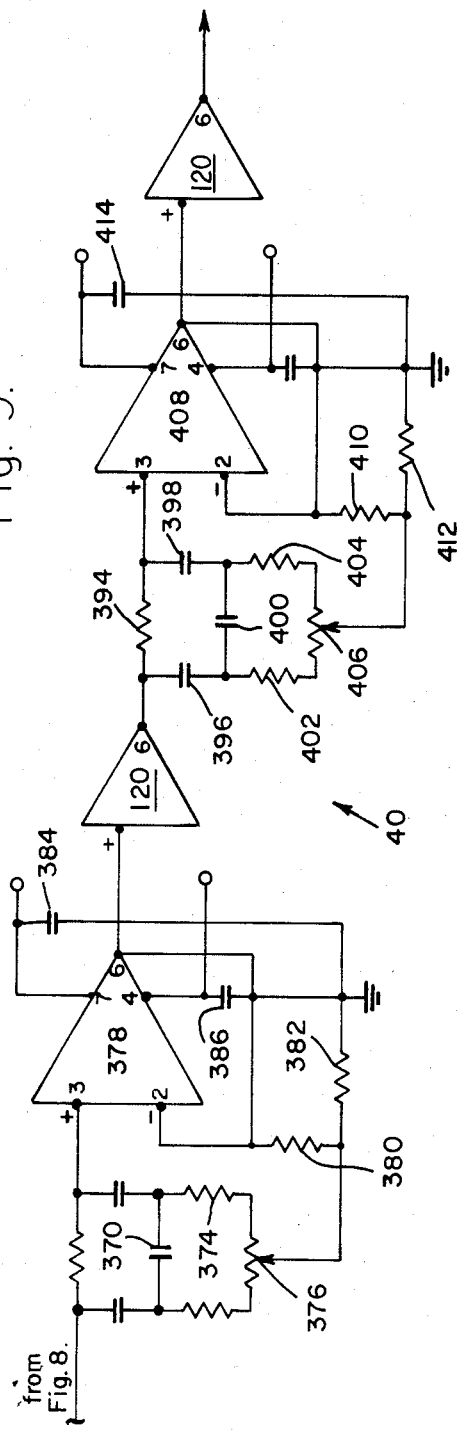
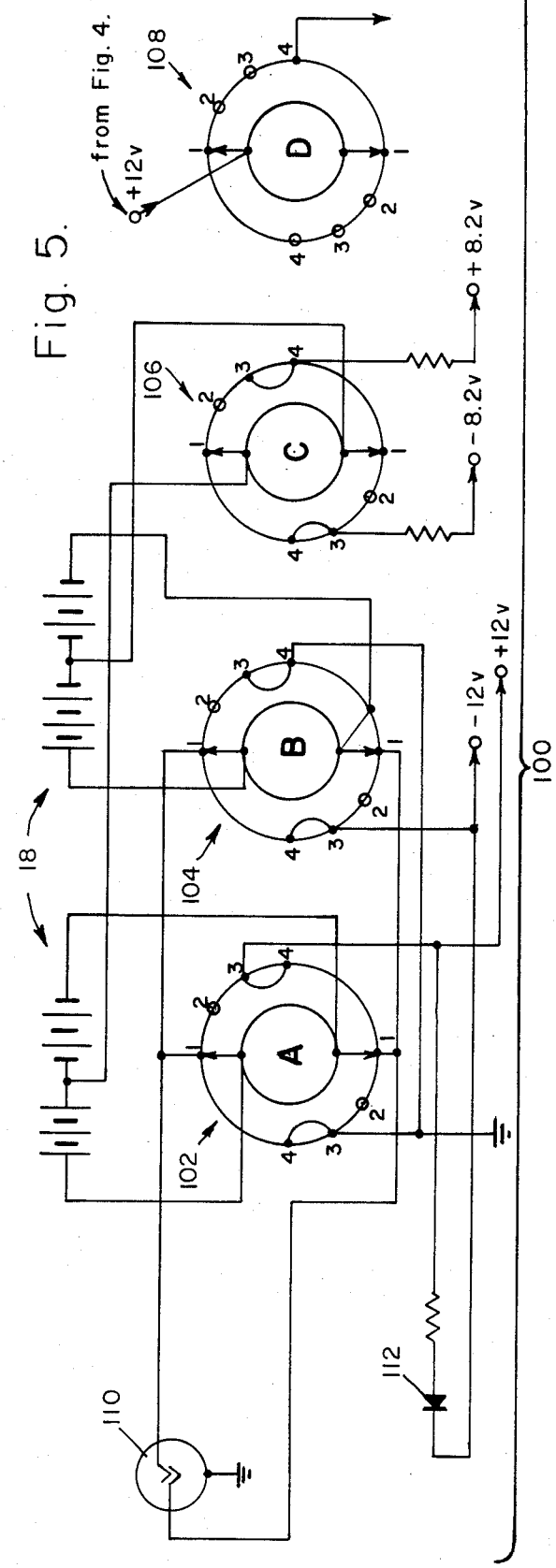

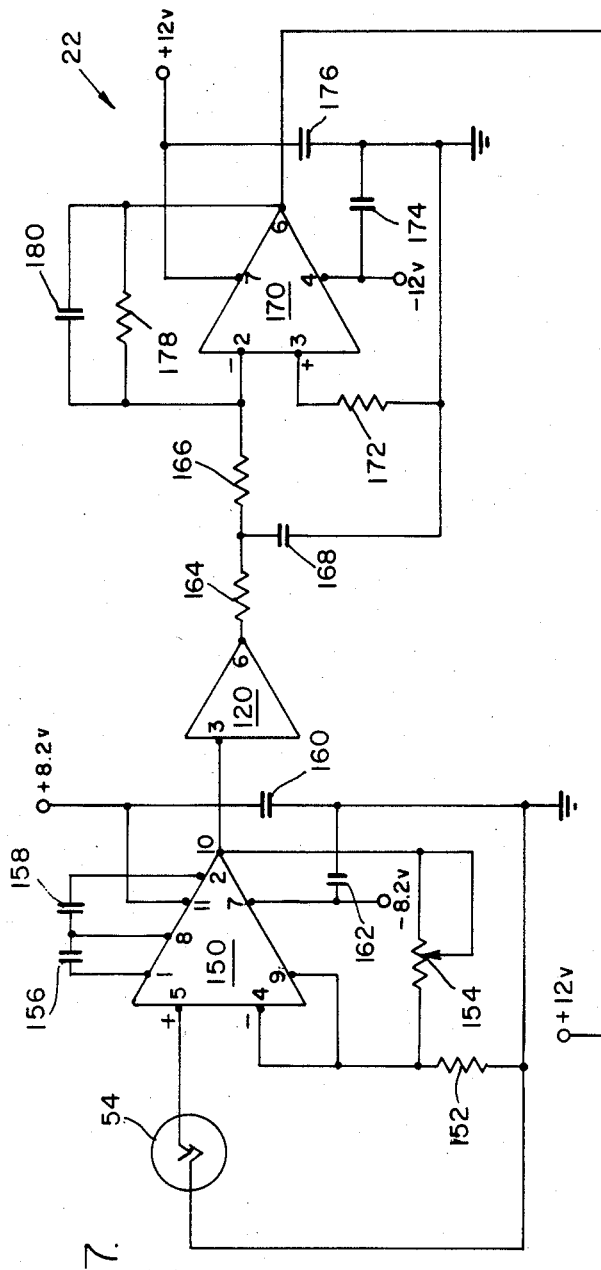
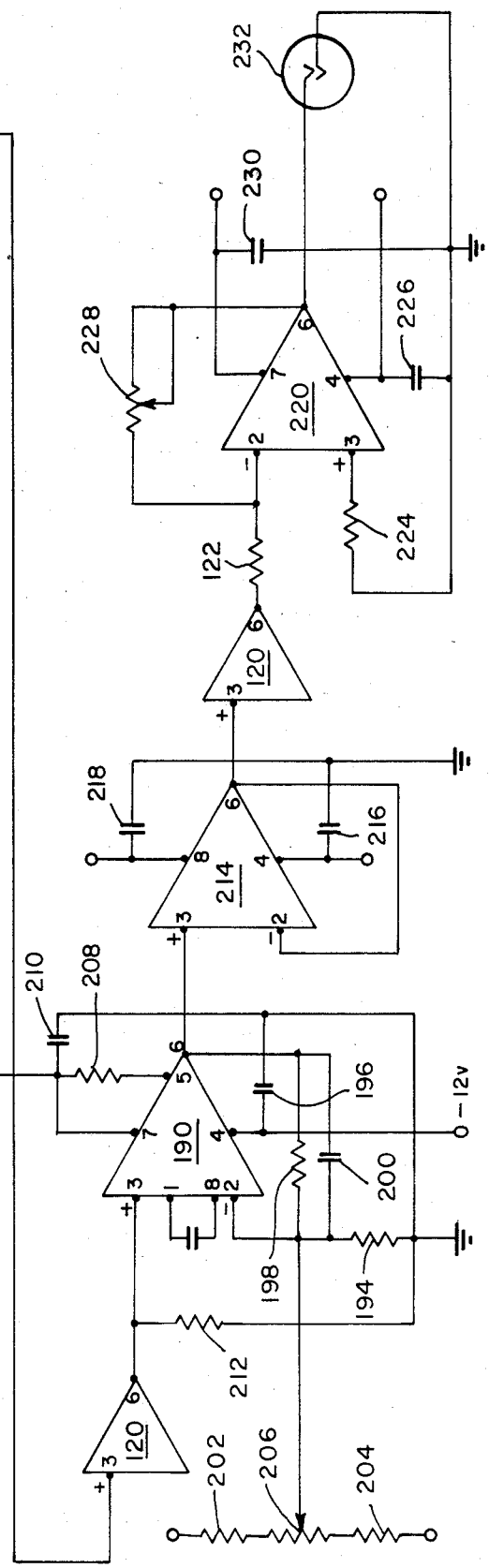
Fig. 7.

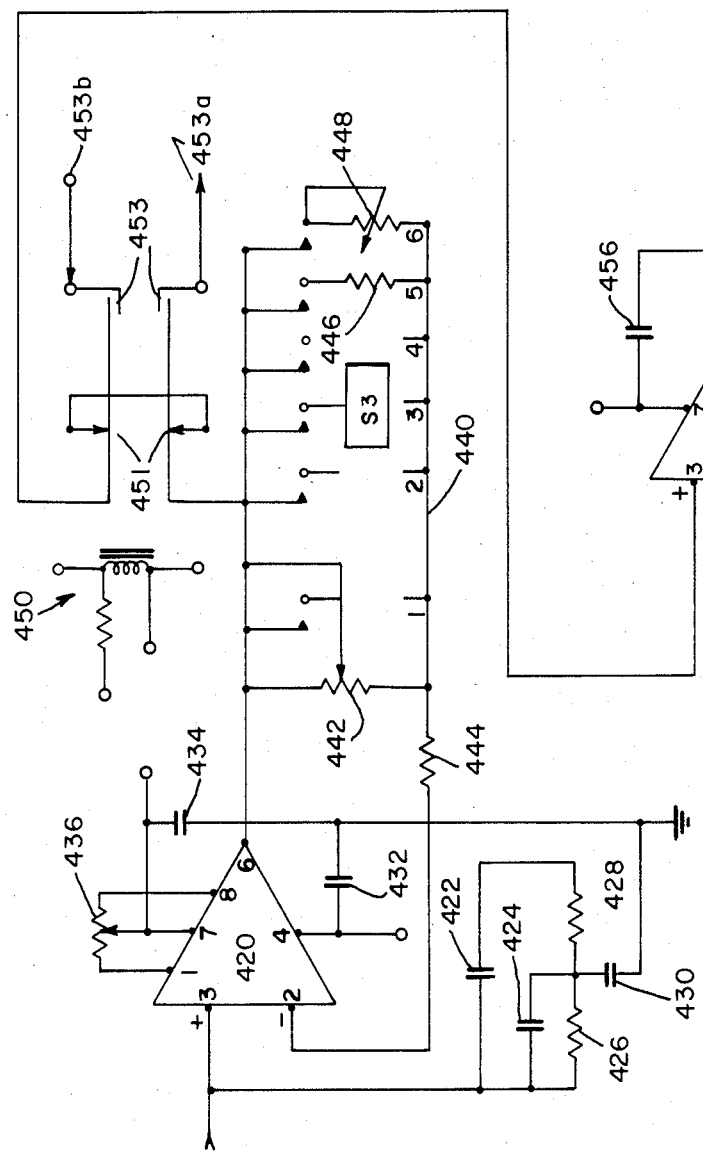
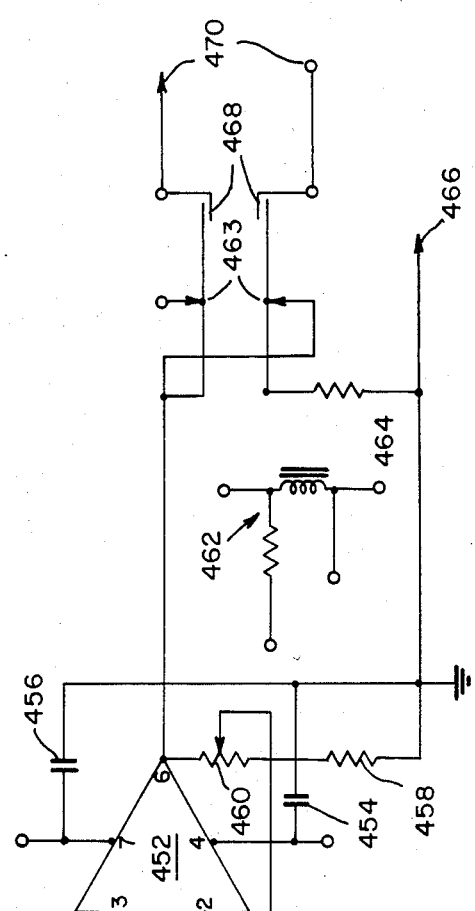
Fig. 10.

NON-SUPERCONDUCTING APPARATUS FOR DETECTING MAGNETIC AND ELECTROMAGNETIC FIELDS

BACKGROUND OF THE INVENTION

1. Field of the Invention

The present invention relates to an apparatus for detecting magnetic and electromagnetic waves or fields through use of non-superconducting materials. The present invention relates to apparatus which are used to measure such fields in order to predict earthquakes, volcanic eruptions and other violent earth movements which generate substantial abberations in magnetic and electromagnetic fields. The present invention can be used to detect any fluctuating magnetic or electromagnetic fields regardless of their origin. The present invention incorporates the use of antennae for the electromagnetic components and coils to detect magnetic fields, in conjunction with electronic elements involving amplification, smoothing elements, frequency response networks, networks to make frequency response uniform within the band and notch filters where necessary. The invention can be used to detect field emissions of electromagnetic and magnetic waves within the range of approximately 0.1 to 50,000 Hertz for magnetic field detection and approximately 1 kilohertz to 1 megahertz using a calibrated loop or other antennas for electromagnetic detection. Other applications involve the detection, measurement and characterization of magnetic and electromagnetic fields from other geophysical sources, storm fronts, upper atmospheric/ionospheric disturbances from solar wind activation effects, etc. The invention can be used to measure emissions from Video display terminals or other equipment emitting magnetic or electromagnetic fields within the bandwidth of the invention. Determination can be made of ELF/VLF emissions of possible biological significance to those exposed to or who operate VDTs, or who live or work near areas emitting low level fields of natural or artificial origin.

2. Description of the Prior Art

Relevant prior art extends back to 1876 with the invention of the telephone by Alexander Graham Bell. Improvements in the form of combination of a coil, diaphram and magnet in the telephone receiver were made which were used to detect magnetic field changes created by acoustic activation. Electric impulses were generated which varied directly with the acoustic waves transmitted by the telephone transmitter and sent these electric impulses over wires to the coil-diaphragm-magnetic core. These fundamental discoveries have led over the years to magnetic field coil detection apparatus of more sophistication and sensitivity in uses varying from oil location to detection of magnetic changes in the human heart and brain.

In prior art applications of magnetic detection apparatus, the core of the coil was usually made of soft iron or high permeability ferromagnetic material. These systems have suffered from limited bandwidths, poor frequency response and signal to noise ratios. Improvements in the core material have been made, but improvements have only led to field detection with inadequate sensitivity and poor resolution. Earthquake, weather, lightning and Geologic frequencies are in the approximate range of 0.1 Hertz to 30 KiloHertz and vary in magnetic amplitude from about 0.001 microgauss to a few milligauss, depending upon detection distance from the source. Therefore, significant frequencies are not detected with prior art detection apparatus using previously known coils, including improved coils with cores of mumetal.

Another problem with prior art magnetic or electromagnetic apparatus is that the apparatus can only detect certain catastrophic events such as an earthquake or volcanic eruption either during or after the event but not sufficiently in advance of the event to allow for a prediction of the exact time or location of the occurrence and to allow for preventive measures. The usual geologic activity detection devices such as seismographs are primarily mechanical in nature and only respond to mechanical earth movements. The inventors have experimentally determined that catastrophic events such as an earthquake or volcanic eruption is preceeded by certain subtle electromagnetic and magnetic impulse and sine waves of characteristic shapes and specific frequencies which are caused by movements below the mantle of the earth which extends downward to beyond ten miles from the earth's surface. Such deep magmatic or physical movements within the earth generate fields of magnetic flux which move and interact with the steady state magnetic fields of the earth. Since the earth is constantly rotating, such generated magnetic fields create subtle "wiggles" in the earth's steady state magnetic field between the earth's core and the ionosphere. Such changes within the ionosphere can also be due to heavy particle interactions from solar flare and other activity. Such very fine fluctuations can be precursers to a catastrophic event such as an earthquake. However when they are generated as just described, they are not capable of being detected by presently known apparatus. With presently known apparatus, the time constant is too long to measure those frequencies which allow for prediction of the earthquake. These prior art apparatus are unable to detect electromagnetic pulsations or magnetic pulsations which occur well in advance of (such as 72 hours before) the occurrence of the actual event. Present day researchers are primarily focused on mechanical predictions through use of apparatus such as a seismograph or lasers, and have not appreciated the importance of measuring the subtle and low intensity electromagnetic or magnetic characteristics which can be used to predict the event.

A device which can be used in conjunction with a seismograph is a superconducting quantum interference detector, commercially known as a Squid. This is a very bulky piece of apparatus which incorporates the use of periodic charging with liquid nitrogen and liquid helium which therefore makes such apparatus expensive and dangerous. These devices are flown over the earth's surface in large planes such as the Boeing 747 and are used to map the earth's magnetic field intensity changes. Over a period of several years, daily chartings produce a history of changes which can be charted. However, reading such magnetic field changes does not enable one skilled in the art to predict a catastrophic event such as a volcanic eruption or earthquake because the device does not respond to field fluctuations of much over 2 Hertz. Therefore, although such a device is sensitive to magnetic flux, it does not measure the necessary frequency range to determine the precurser characteristic of seismic activity. The reason for the Squid's failure is that at frequencies much above 0 Hertz, a large impulse field will create a continuous current loop in the Josephson junction of the Squid, which deactivates the entire device. Therefore the Squid is only useful for measuring static magnetic fields above the earth's surface and cannot be used to detect the types of electromagnetic and magnetic fields which can be detected through the present invention.

Squids can also be used to detect the magnetic component of brain waves and heart waves, but in such an application the Squid must be shielded from other extraneous signals. Such shielding requires the use of very heavy and expensive mumetal or other equivalent shielding. While such shielding enables the Squid to detect the waves in the human brain or heart, the necessary shielding to enable it to perform this function shields out the magnetic field of the earth thereby rendering the device useless for detecting magnetic flucations of the earth which can be used to predict geologic activity.

SUMMARY OF THE PRESENT INVENTION

The present invention is a very highly sensitive, non-superconducting magnetic and electromagnetic, oscillatory or A/C field detector utilizing a coil and mumutal core for magnetic field detection and linear or loop antennas for electromagnetic field detection.

The present invention includes a magnetic field low pass detection system which operates to detect frequencies from 0.1 Hertz to 500 Hertz with an essentially flat response and extends to above 1000 Hertz with slightly decreased flat response. Detection sensitivity on the low pass is 0.1 nano-Gauss maximum resolution sensitivity and can be modified to increased sensitivity using a Peltier Junction Refrigerator on the input amplifier. In one embodiment of the present invention, the impedance of the input amplifier is approximately one tera-ohm or 10 to the twelfth ohms (or a million million ohms). By a unique method of processing with electronics including special amplification and filtering methods, the system is perfectly adequate for prediction of earthquake and volcanic activity as well as other geologic activity.

For meassaurements in the ELF and VLF ranges of magnetic field fluctuations, the present invention has a flat frequency response from approximately 0.1 Hertz to 50 Kilohertz. This portion of the system comprises the high pass circuit. The senitivity of the high pass circuit shown here allows magnetic intensity measurements of 0.1 microgauss. The range of electromagnetic frequencies detectible by this device is from approximately 1 kilohertz to 1 megahertz.

The coil antenna can be utilized with both the low pass and the high pass circuits of the invention. The coil can be used with the low pass circuit to measure magnetic field oscillations of from approximately 0.1 to 500 Hertz. Looped monopole or dipole antennas can be matched with an active system network to the input high pass circuit to measure electromagnetic oscillations of from approximately 1 Kilohertz to 1 Megahertz.

In the low pass, the present invention can be calibrated with a zero gauss chamber and helmholtz coil which are directly traceable to the National Bureau of Standards for magnetic sensitivity measurements.

In the high pass, the present invention can be calibrated with secondary standards directly traceable to the National Bureau of Standards with a spectrum analyzer or field intensity meter.

The electronic wave shaping networks of the present invention allows for faithful reproduction of measured wave forms such as sine waves, saw-tooth waves, square waves and impulse waves.

It is therefore an object of the present invention to provide for a detection system which can alternately detect magnetic fluctuations and electromagnetic fluctuations in the LF (Low Frequency—3000 to 30,000 Hertz), VLF (Very Low Frequency—300 to 3,000 Hertz) and ELF (Extremely Low Frequency—0.1 to 300 Hertz) range through a combination of novel circuit configurations and interaction of circuit components.

It is an object of the present invention to provide an apparatus which can be used to detect and predict events such as earthquakes, volcanic activity, solar flares, and storms by detecting the magnetic and electromagnetic energies created by the forthcoming of such events, which frequencies previously known apparatus have been unable to detect and measure. A comparison of a measured frequency with a previously measured frequency will enable a reader to determine the nature of the event which will occur and directionalizing the receiving portion of the present invention will enable the user to determine the source and location of the event. Through use of the present invention, geophysical events can be predicted up to 72 hours before they occur so that preventive or avoidance measures can be taken. Directionalizing also enables the user to identify and exclude unwanted signals.

Other novel features and objects of the present invention will become apparent from the following description of the theory of the invention, the drawing summary and the detailed description of the preferred embodiment taken in conjunction with the drawings.

THEORY OF THE PRESENT INVENTION

Magnetic fields induce a current flow in a conducting media such as a wire which we can detect when the magnetic lines of force cut the coil strands. Current flow is determined by coil characteristics of the impedance and capacitance and a focusing effect which is achieved from the mumetal core in such a manner as to increase and enhance sentivity of the coil antenna. Current, voltage and impedance are related by ohm's law for A/C circuits which is stated as follows: the current flow through any given impedance will be equal to the voltage across that impedance divided by the ohms of that impedance or $I=E/Z$. The power is expressed in terms of the current and resistance as $P=I \times I \times R$ as the resistance is the only kind of circuit element that consumes power.

The coil detector system operates by the usual flux rules where a current is induced in a current carrying conductor as it is cut by magnetic lines of force. To maximize magnetic field detection, the greater the number of current carrying elements used the more efficient the system. The maximum current flow is induced when the magnetic flux is perpendicular to the current carrying wire, hence the coil system can directionalize maximum magnetic field flux direction.

Time varying flux linkages occuring in conducting materials induce a voltage in the conductor, and current flow in the conductor will result. The resulting induced current will flow in a well defined current carrying path. The induced voltage can also be determined. The coefficient of self-inductance is defined as $L=N\Phi/I$ so that the voltage induced in the current carrying wire is $$V = -\frac{dN\phi}{dt} = -\frac{dLI}{dt} = -\left(\frac{LdI}{dt} + I\frac{dL}{dt}\right)$$

where the voltage is measured in volts, where "L"(inductance) is measured in henries and the current change is in amperes per second.

The magnetic flux Φ through an area, "s", is defined in terms of the surface integral of the normal component of the magnetic flux density over the area.

$$\phi = \int_{surface} B\cos\theta ds = \int_{surface} \underline{B} \cdot \underline{ds}$$

where "B" is the magentic flux density at the surface element "ds" and "θ" is the angle between the surface element "ds" and the direction of "B" at the element of area. We can visualize the magnetic flux as the total quantity of lines of magnetic force set up around a current carrying conductor in a medium whose permeability is "μ". The magnetic flux produced by a current "I" in each of "N" closely spaced conductors of length l is a medium whose permeability is "μ" is:

$$\Phi = \mu NIl = B \cdot s$$

In American National Standards Institute units, magnetic field or magnetic flux is measured in Gauss, current in amperes, length in meters and the permeability in henries per meter.

If the closely spaced conductors are small in diameter compared to their circular path diameter about the coil spool, locally we can consider these conducting wires as a series of flat wire fibers having induced currents as magnetic flux cuts their path. The more current carrying conductors present the more current and voltage are induced. There is also a mutual interaction and mutual inductance as a force of magnetic attraction because current in induced in the same directional sense in all the parallel current carrying elements.

At any field point near a linear circuit each circuit element contributes to the magnetic induction by an amount which is inversely proportional to r squared where r is the distance from the circuit element to the point, and is directly proportional to the conductor's length, L the current and the sine of the angle between ds and r and in the direction of ds×r where ds is the differential element of the circuit element. The magnetic induction acts in the same direction.

A series of conductive wires which are parallel will experience current flow in the same direction under the influence of a varying external magnetic field. As current flow occurs a secondary mutually inductive magnetic field will be produced with lines of force perpendicular to the direction of current flow. Th curl of these fields will be in the same sense produced by each conductive element.

A magnetic field is defined as a vector property of space or material body capable of exterting a force on a moving charge to accelerate the charge in proportion to its magnitude, direction and its speed to that of the field. In general the magnetic field may vary with time and is a vector function of the position at which a force acts in a transverse direction on the moving charge and the current flow depends on the medium in which the charge moves. We can specify the effect of magnetic fields on or by a material substance in terms of the magnetic permeability, "μ".

We can define the magnetic field in terms of the magnetic induction of flux density, "B" or the magnetic field strength "H" or the magnetization "M" of a magnetic substance.

The magnetic flux density $B=F/NIl$ is the force per magnetic test body of a magnetic field acting on current. The magnetic field strength $H=NI/l$ is produced by the direct motion of free or mobile charges and applied only to what is termed "true" currents.

The magnetization "M" is the magnetic dipole moment per unit of volume. It is applied to material substances under magnetic stress and is zero in free space. The relation for the three magnetic vectors holds as follows: $B=\mu_o H+M$ where "$\mu_o$" is the permeability of free space.

Theoretically, according to antenna theory, the length of a receiving antenna should be of the same order of size as the wavelength of the electromagnetic signal being transmitted and received by that antenna, for ideal reception. For signals in the ELF and VLF band in the range 0.1 to 3,000 Hertz, this would presumably require an antenna of the size 3 times 10 to the sixth power Kilometers to 100 kilometers, respectively. This ideal situation assumes such an antenna is linear in form and approximates being in straight line configuration.

In fact, antennas in the form of wire wrapped on a spool in a cylindrical configuration operate as a very nonlinear pickup system with properties that increase the pick-up efficiency greatly over linear type arrays. Therefore efficient signal reception can be accomplished with antenna lengths far shorter than the actual wavelength of the detected signal. For example, antenna lengths of 150,000 feet or 17.05 kilometers are sufficient to detect signals in the ELF range when amplified by the appropriate nonlinear RC network circuits.

The principle involves that any signal that is detected or read as apparent informational content received by a nonlinear pickup system is greater than for a linear one. Nonlinearities allow for "informational redundancies" and greater informational content density in the spool wound antenna in which all the flux received propagates through many strands of wire (for example in one embodiment of the present invention utilizing number 44 American wire gauge (AWG) rather than antenna wire many kilometers in length along a straight path which receives a single impulse signal with wave length on the order of the wire length through that length of wire).

Each ELF impulse cuts a series of overlapping wires in the coil system. The highly nonlinear nature of the coil system allows for its unique ability to effectively detect signals in the ELF range in such a manner that a small nonlinear impulse can be detected as a sufficiently large impulse signal and amplified by an appropriate circuit.

Because the input signal is detected by a very nonlinear system, the electronic amplifier and notch filtered circuit must be nonlinear also to translate the detected signal into its original wave form and relative intensities. Our system accomplishes this task and has a flat response from less than approximately 0.1 Hertz to 50,000 Hertz giving a realistic representation of ambient signal intensity at each of these frequencies.

Both coil and linear wire systems are directional, that is, can direction find to pin point the detected signal origin. Triangulation is accomplished by either three simultaneously directed detectors with data relayed to a single pick-up receiving location and/or each system can be utilized with three axis sequential measurements such as Vertical, North-South and East-West and in between directional reception. Also pick-up coil systems can be constructed to detect three or more simultaneous coordinate directions with each detector circuit unit with readout.

The coil system enhanced efficiency can be expressed in the following example case. The wire length we use is approximately three thousand times shorter than the wave length of a 7 Hertz wave. By wrapping the single wire antenna onto a spool we create a set of parallel conductive wire paths. In response to an imposed varying magnetic flux these conductive pathways experience both a current and voltage which arises in them in such a manner that the current flow acts both as a current in a long individual unbroken length of current carrying conductor and in concert with current flow in a series of parallel current carrying conductors which interact with mutual inductances. These parallel paths in a small region of space can be treated as a flat array of parallel wire filaments. As a whole these filaments comprise a series of circular elements about a hollow core (which can be constructed of various diameter) all of which contain a different diameter when viewed along a cross sectional slice perpendicular to the long axis of the coil. Also these filaments are not separate but are part of a continuous strand of a wire antenna. The volume of the wire strands can be treated as the integral volume within a minimum radius, $R_1$ and maximum radius $R_2$ and cylinder length "l". The wire length is given as "$L_o \sim 1.5 \times 10^5$ feet in one example case for one embodiment of the invention.

The system operates both by its continuous extension as one conducting element and also by the mutual inductance and interaction of the secondary induced magnetic field from the current flow in the series of approximately parallel conditions. The simultaneously induced magnetic fields of each conductor path is interactive and reinforced by the mumetal shield contained within the core. It has been found that the most efficient coil operation is with three wraps of a single piece of mumetal with a permeability of the order of $1.5 \times 10^5$ henries per meter.

The current induced in a circuit due to a change in the magnetic flux through it or to its motion in a magnetic field is so directed as to oppose the change in flux or to exert a mechanical force opposing the motion. The principle is termed Lenz's law and is utilized in our device in such a manner to increase the coil pickup efficiency.

The efficiency of the system in detecting external magnetic fields is determined by the characteristics of the coil detector and the signal to noise ratio of the electronic processing system and the matching of the coil properties to the electronic system.

The efficiency of the coil itself in detecting is dependent upon the conductivity of the wire, $\sigma$, the wire length, $L_o$, and the configuration of the wire such as linear or wound in a right circular cylindrical configuration (having direction determining characteristics) or spherical configuration or other form.

The mutual inductance of the Coil and Core and the permeability of the material in the Core is a significant factor, as well as the Coil Wire Turns (squared) which depends on $L_o$ and Coil dimensions determines Coil sensitivity.

Optimum Coil configuration also relates to the actual geometric configuration of the windings of the Coil i.e. the inner radius, outer radius, and length as well as $L_o$ and hence the wire diameter which also determines the inductance of the system.

Copper itself has practically the same permeability as air and will not distort an external magnetic flux. An iron core, having thousands of times more permeability than air and mumetal which has hundred of thousands more permeability than air are highly acceptable media in which lines of magnetic force may exist. The lines are free to expand in the "highly repetitive" areas and therefore the flux density can be large. The higher permeability properties of the filled core act as a guiding center for the lines of flux.

Coil efficiency in terms of sensitivity depends upon and is proportional to:

$$\Lambda = (G_{vs}\sigma p L_o M_L)/R_c$$

where $G_{vs}$ depends on the geometry of the detector system where, in general we maximize volume to surface ratios in such a manner to maximize $L_o$ as related to compactness and mutual inductance response of the coil wires. Resistance which exists in all electronic circuits reduces efficiency and also capacitative effects will effect efficiency. We include a term, $R_c$ which expresses dependences on these type of terms. For example, for a hollow core (no wires or material in core) right circular cylindrical coil for $R_1 = \frac{1}{3}R_2$ and $l = 4R_2$ and $G_{vs} = R_2/S$ with wire conductivity $\sigma$ and mass density per unit length $L_o$ termed $\rho$ and core coil mutual inductance $M_L$. The inductive properties of the system depends on geometric factors also such as $R_1$, $R_2$ and $l$.

In one example detector system, for the 1.75 pounds (0.79 Kilogram) copper coil, we have $L_o = 150,000$ feet (17.05 Kilometer) of number 44 AWG wire with 386.56 Kilohms resistance. The wire diameter is 1.97 mils or 7.76 times 10 to the minus 4 centimeters. The coil dimensions and $l = 8.89$ centimeters, $R_2 = 6.98$ centimeters and $R_1 = 2.22$ centimeters so that $l/R_2 = 1.3$ and $R_2/R_1 = 3.15$.

Complex coil probe winding can be used but the relationship of wire winding direction and overlap as well as the compactness of wire winding, effect wire mutual inductance and hence total coil efficiency.

Most receiver antennas are tuned circuits which act to resonate at a definite frequency or narrow frequency range. We can treat the coil as a resonant inductive circuit with stray capacitance due to the insulatuon on the wire acting in adjacent layers. We can calculate the primary resonant frequency. All LC circuits have some resistance in the L and C components. At resonance the inductive and capactive reactance are equal for A/C detection.

The resonant frequency is given as $$f_r = \frac{1}{2\pi} \sqrt{\frac{10^6}{LC}}$$

where L is the inductance in henries (about one million henries) and C is the capacitance in microfarads (about one nanofarad, as determined experimentally and theoretically).

For the low pass circuit, the coil is in series to the circuit and with the high pass circuits the coil is in parallel. For the example 1.75 pound coil (0.79 kilograms), the coil resonant frequency for use in the low pass circuit is $f_r \approx 48$ H$_3$.

To insure the determination of pure magnetic field detection in mode, the coil is enclosed in an electric shield of conducting material. For single ended operation, the outer coil conductor is attached to the shield ground and in double ended or differential operation the coil conductors are routed to the input amplifier.

Other coils such as a 2.48 pound (1.13 kilograms) #44 AWG wire of similar slightly larger coil dimensions allow somewhat small field intensity detection capabilities. Diminishing returns on size and length $L_o$ occur both in terms of mechanical bulk and weight considerations and diminishing efficiency gains due to increasing size, length $L_o$ and other other parameters. Other coils utilizing the number 41 AWG and other wires and materials have been used and can be modified for various applications.

Many changes and modifications in the above described embodiment of the invention can of course be utilized without departing form the scope thereof. For example, various coil sizes and wire lengths can be utilized. Greater $L_o$ and also R$_2$ to 1 ratios (and visa versa) can be used. One must weigh the detector efficiency, large $L_o$ versus coil mass and bulkiness in the various desired uses of the device. Accordingly, the scope of the invention is intended not to be limited to the specifications of design.

DRAWING SUMMARY

Referring to the drawings for the purpose of illustration only and not limitation, there is illustrated:

FIG. 5 is a schematic view of the battery pack and in/out charge and notch switch section of the Input/Output wafer switch.

FIG. 7 is a circuit diagram of the Low Pass Electronics and Filtering Network.

FIG. 9 is a schematic diagram of the second portion of the Master Notching Network For The High Pass Circuit.

FIG. 10 is a schematic diagram of the High Pass Electronics And/Or Filtering Network including Relay Switching, Gain Setting Attenuator Network and the Equalizer Network.

DETAILED DESCRIPTION OF THE PREFERRED EMBODIMENT

Figure 1:
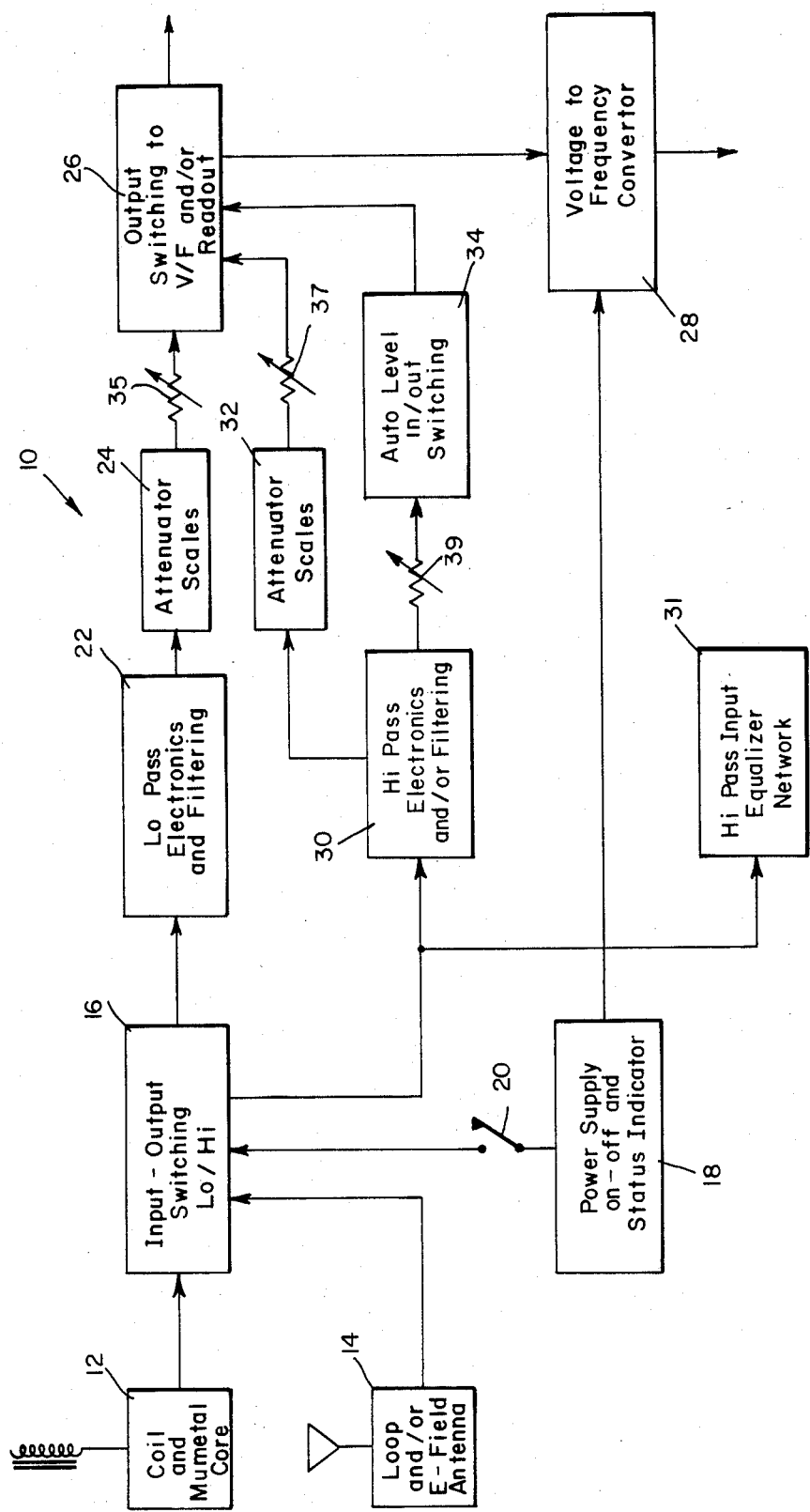
FIG. 1 is a block diagram of the present invention.

Although the apparatus and method of the present invention will now be described with reference to specific embodiments in the drawings, it should be understood that such embodiments are by way of example and merely illustrative of but a small number of the many possible specific embodiments which can represent applications of the principals of the invention. Various changes and modifications obvious to one skilled in the art to which the invention pertains are deemed to be within the spirit, scope and contemplation of the invention as further defined in the appended claims.

A block diagram of the present invention Non-Superconducting Apparatus For Detecting Magnetic And Electromagnetic Fields is shown at 10 in FIG. 1. The invention includes a low pass and a high pass circuit. Receiving means are at the input end of each circuit. At the input end of the low pass circuit is a coil 12 containing a mumetal core. At the input end of the high pass circuit is an antenna 14 which can be either a calibrated loop directionalizing antenna or a calibrated E-Field electromagnetic antenna. Both the input coil 12 and antenna 14 are connected to an input-output switching network means 16. This switching network means allows the user to select whether the low pass or the high pass circuit will be operating at a given time. The input-output switching network 16 is connected to a power supply means 18 through switch 20. The power supply 18 is preferably a DC current source rechargeable battery pack.

When the input-output switching network 16 is moved to the low-pass position, the input from coil 12 travels through the switching network 16 to low pass electronic circuit 22 which includes filtering means and an input amplifier of very high impedance and/or frequency multiply-redividing means. From there the current passes into a means 24 for attenuating the signal in calibrated decade scales. The means 24 is a variable calibration means for performing such attenuation. From there the signal passes to output switching network means 26 which allows the completely processed signal to be coupled to a readout such as a spectrum analyzer or an oscilloscope or a computer (not shown). Simultaneously (or separately), the signal from the output switching network 26 can be fed into a Voltage to Frequency Converter means 28 which permits the signal to be recorded on conventional tape recorders for later analysis.

When the input-output switching network 16 is moved to the high pass position, the input from the calibrated loop or antenna 14 is routed to high pass electronic circuit means 30 which includes filtering means and an input amplifier means of impedance which is lower than the impedance of the low pass electronic circuit 22. Simultaneously, the signal passes through a high pass input equalizer network means 31 which provides the correct impedance matching to allow measurements of electromagnetic signal sensing up to approximately 1 Megahertz. The signal from the high pass electronic circuit 30 is then split. Part of the signal travels into a means 32 for attenuating the signal in calibrated decade scales. The means 32 is a variable calibration means for performing such attention. From there the signal passes to output switching network means 26 which allows the completely processed signal to be coupled to a readout means such as a spectrum analyzer or an oscilloscope (not shown). Simultaneously (or separately), the signal from the output switching network means 26 can be fed into a voltage to Frequency Converter means 28 which permits the signal to be recorded on conventional tape recorders for later analysis. A portion of the signal from the high pass electronic circuit is routed into an auto leveler means 34 whose function is to cause all incoming signals to be equal in amplitude. This allows a quick assessment of the total number of signals being processed since all frequencies being received is set forth equivalently. This further permits the various frequencies to be easily separated. The signal from the auto leveler means 34 is also routed into output switching network 26 which allows the completely processed signal to be coupled to a readout such as a spectrum analyzer oscilloscope or a computer (not shown). Simultaneously (or separately), the signal from the output switching network 26 can be fed into a Voltage to Frequency Converter means 28 which permits the signal to be recorded on conventional tape recorders for later analysis.

The present invention can also include other components such as Variable Resistors to calibrate devices. For example, referring to FIG. 1, Variable Resistor 35 can be 1 Megaohm and used to calibrate Attenuation Scale Means 24. Variable Resistor 37 can be 1 Megaohm and used to calibrate Attenuation Scale Means 32. Variable Resistor 39 can be 20 Kilohms and is used to calibrate said High Pass Circuit Means 30. An optional Switch Means 20 can be located between said Input/Output Switching Means 16 and said Power Supply Means 18.

Figure 2:
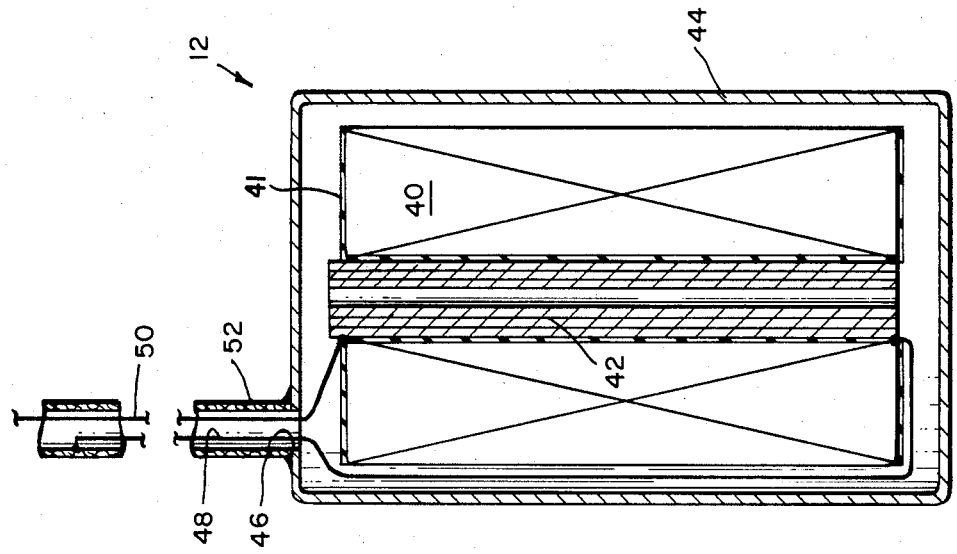
FIG. 2 is a diagramatic view of the input Coil and its parts shown for a single ended input.

FIG. 2 is a diagrammatic view of the coil 12 of the present invention. The coil 12 is composed of a central coil winding 40 which can be wound with insulated number 44 American Wire Gauge Copper Wire. By way of example, the number of turns can comprise approximately 20 kilometers of wire. Within the winding 40 which is wrapped around a dielectric form or spool 41 is a central core 42. The core 42 can be made of 10 gauge sheet mumetal which can have a high permeability of 250,000 mu henries per meter. The sheet mumetal can be wound into a cylinder with three wraps and inserted into the dielectric form or spool 41 located within the winding 40. This special core 42 serves to guide all of the lines of magnetic flux into the winding 40. The winding 40, the dielectric form or spool 41 and the core 42 are totally enclosed within a container 44. The container 44 can be made of thin sheet copper. A tiny opening 46 in the container 44 permits the two lead wires 48 and 50 from the winding 40 to exit the container 44. The lead wires 48 and 50 are connected to an input jack 54 of the low pass electronic network 22. The lead wires 48 and 50 are surrounded by a shielding member 52 which is affixed to the circumference of the opening 46 in the container 44 and serves to entirely shield the lead wires 48 and 50 from the container 44 into the input connector jack of the input-output switching means 16.

Figure 3:
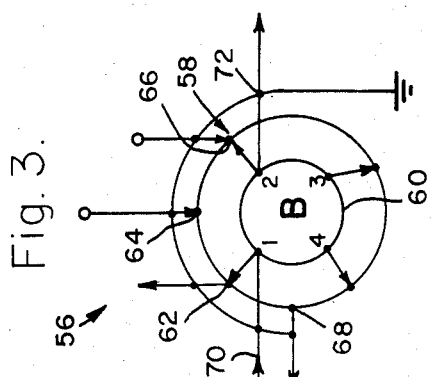
FIG. 3 is a schematic view of a first wafer section of the Input/Output wafer switch.
Figure 4:
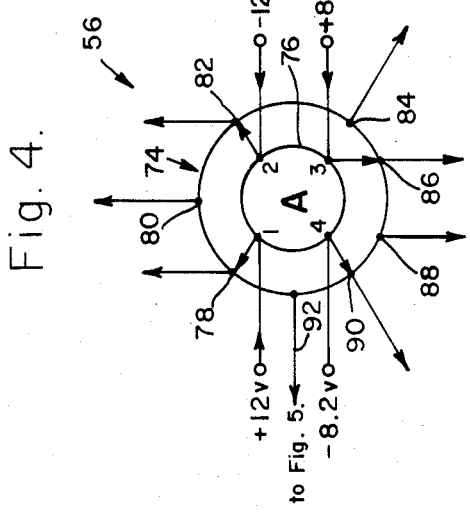
FIG. 4 is a schematic view of the second wafer section of the Input/Output wafer switch.

FIGS. 3 and 4 are diagrammatic views of the two section input/output wafer switch 56 which is used to direct signals and voltages to the low pass and high pass circuits. FIG. 3 discloses the portion 58 of the wafer switch 56 which is used to direct signals between the two circuits. The signal directing portion 56 comprises 4 positions 1, 2, 3, and 4 located on the rotating ratchet portion 60 of the wafer switch portion 58, and further comprises Poles 62, 64, 66 and 68 on a non-movable base portion. Pole 62 leads to the amplifier input of the high pass circuit. Pole 64 leads from an amplifier input of the low pass circuit back into the switch. Pole 66 is an amplifier input from the high pass circuit back into the switch. Pole 68 is an amplifier input into the low pass circuit. The signal comes from the coil 12 into BNC Jack 70 on the switch 56 and leads to position 1. In the position as shown in FIG. 3, current is routed to and from the high pass circuit through positions 62 and 66. If the switch is rotated counterclockwise one position, the signal would be routed to the low pass circuit through positions 64 and 68. Other positions on the switch not discussed are not used. An output signal also travels through BNC jack 72 into a readout device. The second portion 74 of switch 56 also contains four positions, 1, 2, 3 and 4 on a rotating ratchet portion 76 and Poles 78, 80, 82, 84, 86, 88, 90 and 92. Pole 78 routes plus 12 volts to the amplifier of the high pass circuit. Pole 80 routes minus 12 volts to the amplifier of the low pass circuit. Pole 82 routes minus 12 volts to the amplifier of the high pass circuit. Pole 84 routes plus 8.2 volts to the amplifier of the low pass circuit. Pole 86 routes plus 8.2 volts to the amplifier of the high pass circuit. Pole 88 routes minus 8.2 volts to the amplifier of the low pass circuit. Pole 90 routes minus 8.2 volts to the amplifier of the high pass circuit. Pole 92 routes plus 12 volts to the amplifier of the low pass circuit. Position 1 has plus 12 volt coming in from another switch to be described in FIG. 5. Position 2 has minus 12 volts coming in from another switch as shown in FIG. 5. Position 3 has plus 8.2 volts coming in from another switch and Position 4 has minus 8.2 volts coming in from another switch also in FIG. 5. Therefore, when the switch portion 74 is in the position as shown, plus and minus 12 volts are routed to the amplifier of the high pass circuit and plus and minus 8.2 volts are routed to the amplifier of the high pass circuit. When the rotating ratchet 60 is rotated counterclockwise by one position, then the same voltages are routed to the low pass circuit.

The two portions of the switch 56 shown in FIGS. 3 and 4 are ganged together. Therefore the activity just discussed happens simultaneously when the switches are in the set positions discussed. The switch is a 4 pole, 2 position 3 section switch, of which only two sections are used.

FIG. 5 discloses the Power Supply and Main Switching network 100, part of which is connected to the switch just discussed and shown in FIGS. 3 and 4. This is an 8 pole 4 position rotary wafer switch. The Switching Network 100 comprises four identical such switches as shown at 102, 104, 106 and 108 of FIG. 5. The switches are connected to the power supply 18 as shown in FIG. 5. The power supply comprises a multiplicity of batteries which generate plus and minus 12 volts. However, with the switching mechanism as shown, the batteries can be tapped to also supply a reduced voltage of plus and minus 8.2 volts. Each switch 102, 104, 106 and 108 has two sets of four Poles on oppositely disposed sides as shown in FIG. 5. The four switches are stacked one on top of the other or in tandem so that the rotation to a particular position is simultaneously made on all four switches. When the switches are turned to the position where Pole 1 is activated on each switch, it parallels the batteries and routes the circuit to a charger jack 110 which serves to charge the batteries. When the switches are rotated to Pole 2, the switches are turned off. When the switches are rotated to Pole 3, the current is routed so that plus in parallel. Resistor 198 can be 100 Kilohms and Capacitor 200 can be 0.1 Microfarad. Also in the feedback network is an offset adjustment network comprised of three Resistors, fixed Resistors 202 and 204 which can each be 100 Kilohms and Variable Resistor 206 which can be 20 Kilohms. Pins 5 and 7 are connected together via Resistor 208 which can be 100 Kilohms. Pin 7 is also connected to the plus 12 volt supply switch and is also routed to ground via Capacitor 210 which can be a 0.01 Microfarad Capacitor. The Signal leaving Notch Filter 120 is also routed to ground via Resistor 212 which can be 56 Ohms. This portion of the circuit serves to convert a voltage to a current and to further equalize the very low frequency (0.01 to 15 Hertz) components while at the same time reducing the voltage noise figure contributed by the other amplifiers.

The signal leaves output pin 6 of Amplifier 190 and travels to Amplifier 214 which can be one half of a dual chip amplifier such as 353A made by Texas Instruments or Signetics. This is a very high (10 to the 12 Ohms) input impedance amplifier. This is needed to work with the transconductance Amplifier 190 which requires a high impedance load. The Amplifier 214 has 8 pins of which 5 are used. Amplifier 214 is a unity gain amplifier. The Signal which is a non-inverting input enters Amplifier 214 via Pin 3. Pin 2 is connected to Output Pin 1 which causes the Amplifier 214 to have unity gain. Pin 4 is connected to the minus 12 volt input switch and is also routed to ground via Capacitor 216 which can be a 0.01 Microfarad Capacitor. Pin 8 is connected to plus 12 volt input switch and is also routed to ground via Capacitor 218 which can be a 0.01 Microfarad Capacitor.

The Signal then travels from Output Pin 6 of Amplifier 214 into another 60 Hertz Notch Filter 120. This last 60 Hertz Notch Filter 120 removes any remaining 60 Hertz noise. The Signal then travels from 60 Hertz Notch Filter 120 to Power Amplifier 220 which boosts the output signal. Amplifier 220 is a very low noise high speed precision amplifier such as Linear Technologies LT 1037. The Signal travels from 60 Hertz Notch Filter 120 to Resistor 222 which can be 47 Kilohms and enters Amplifier 220 via Pin 2 which is the inverting pin. Pin 3 is routed to ground via Resistor 224 which can be 47 Kilohms. Pin 4 is connected to the minus 12 volt input switch and is also routed to ground via Capacitor 226 which can be a 0.01 Microfarad Capacitor. Output Pin 6 is the gain setting pin which is routed back to Pin 2 via Variable Resistor 228 which can be 1 Megaohm low noise multiturn trim pot. Pin 7 is connected to the plus 12 volt input switch and is also routed to ground via Capacitor 230 which can be a 0.01 Microfarad Capacitor.

The signal then travels from Output Pin 6 of Amplifier 220 into Output Jack 232 after having been processed by an output switching network which is part of the input/output switch shown in FIGS. 3 and 4. It is important to note that as the signal is passed through the various amplifiers in the low pass circuit, the signal is initially inverted and finally returned to normal phase. In Amplifier 150, the signal entering through Pin 5 is normal phase. The signal entering Pin 2 of Amplifier 170 is inverted 180 degrees. The Signal entering Pin 3 of Amplifier 190 is not inverted and remains 180 degrees out of phase and also remains this way when it enters Pin 3 of Amplifier 214. The Signal is returned to Normal Phase when it entered Pin 2 of Amplifier 220. This phase shift is necessary for the apparatus to work properly. Amplifier 220 has a gain of approximately 21 times the input signal.

The Signal then passes to the Gain Setting Network or Attenuation Circuit 32. The details of this Attenuation Circuit is shown at 606 in FIG. 13 and comprises elements 606a, 606b and 606c. While they are wired accross pins 14 and 15 in Amplifier 602 of that circuit, the same components are wired across Pins 4 and 10 of Amplifier 150 in FIG. 7.

The next portion of the circuit which will be described is the Master Notching Network for the High Pass Circuit 30. The Master Notching Network 300 is shown partially in FIG. 8 and Partially in FIG. 9. The Master Notching Network 300 comprises four 60 Hertz Notch Filters 120 and four additional Notch filters which are 180 Hertz, 120 Hertz, 420 Hertz and 300 Hertz respectively. As can be seen from FIGS. 8 and 9, each filter (180, 120, 420 and 300 Hertz) has the same components and the only difference are the values of the components. Therefore, for ease of discussion, the components will be numbered and the values presented in chart form. As with all other values mentioned in this patent, it is understood that these are representative values and are not the only values with which the present invention can work or be limited.

For the 180 Hertz Notch Filter 302, the components and values are as follows:

| Component | Number | Value |
|---|---|---|
| 1. Resistor | 304 | 620 Kilohms |
| 2. Capacitor | 306 | 0.015 Microfarads |
| 3. Capacitor | 308 | 0.015 Microfarads |
| 4. Capacitor | 310 | 0.015 Microfarads |
| 5. Resistor | 312 | 4.7 Kilohms |
| 6. Resistor | 314 | 75 Kilohms |
| 7. Variable Resistor | 316 | 20 Kilohms |
| 8. Low Noise High Speed Amplifier | 318 | LT1037 - Linear Tech. |
| 9. Resistor | 320 | 68 Ohms |
| 10. Resistor | 322 | 2.2 Kilohm |
| 11. Bypass Capacitor | 324 | 0.01 Microfarad |
| 12. Bypass Capacitor | 326 | 0.01 Microfarad |
| Plus 12 volts power switch into Pin 7 | | |
| Minus 12 volts power switch into Pin 4 | | |

For the 120 Hertz Notch Filter 332, the components and values are as follows:

| Component | Number | Value |
|---|---|---|
| 1. Resistor | 334 | 620 Kilohms |
| 2. Capacitor | 336 | 0.022 Microfarads |
| 3. Capacitor | 338 | 0.022 Microfarads |
| 4. Capacitor | 340 | 0.022 Microfarads |
| 5. Resistor | 342 | 4.7 Kilohms |
| 6. Resistor | 344 | 75 Kilohms |
| 7. Variable Resistor | 346 | 20 Kilohms |
| 8. Low Noise High Speed Amplifier | 348 | LT1037 - Linear Tech. |
| 9. Resistor | 350 | 68 Ohms |
| 10. Resistor | 352 | 2.2 Kilohms |
| 11. Bypass Capacitor | 354 | 0.01 Microfarad |
| 12. Bypass Capacitor | 356 | 0.01 Microfarad |
| Plus 12 volts power switch into Pin 7 | | |
| Minus 12 volts power switch into Pin 4 | | |

For the 420 Hertz Notch Filter 362, the components and values are as follows:

| Component | Number | Value |
|---|---|---|
| 1. Resistor | 364 | 401 Kilohms | and minus 12 volts and plus and minus 8.2 volts are routed to the switches 56 as previously described. Poles 3 and 4 on Switch 102 are wired together and route plus 12 volts. Poles 3 and 4 on Switch 104 are wired together and route minus 12 volts. Poles 3 and 4 on Switch 106 are wired together and route minus 8.2 volts. Poles 3 and 4 on the opposite side of Switch 106 are wired together and route plus 8.2 volts. Switch 108 is off at Poles 1, 2 and 3 and is only activated at Pole 4. At Pole 4, Switch 108 routes plus 12 volts to a relay to be described for the purpose of inserting 8 notches in the high pass circuit, to be described. Also shown in FIG. 5 is a LED Indicator 112 to show if the apparatus is on or off.

The lead wires 48 and 50 from coil 12 enter Switch Portion 58 at Position 1 on rotating member 60. When the switches are set for routing to the low pass circuit, the current and voltage then travels to the low pass ciruict.

A key electronic circuit which is duplicated in several places of the present invention is a 50 or 60 Hertz tunable notch circuit filter 120. Sixty (60) Hertz is used in America and 50 Hertz is used in Europe. For purposes of the present discussion, only 60 Hertz will be discussed. The central member of Notch filter 120 is an amplifier 122 which has 8 pins as shown. An input Resistor 124 which can be 620 kilohohms is wired into pin 3 of Amplifier 122. On each side of Resistor 124 are Capacitors 126 and 128 which can be 0.047 microfarad Capacitors. Capacitor 126 is wired in series to Resistor 130 which can be 4.7 Kilohms. Capacitor 128 is wired in series to Resistor 132 which can be 75 kilohms. A variable Resistor 134 connects to both Resistors 130 and 132. The variable Resistor 134 can be 20 kiloohms. Wired in parallel with the Variable Resistor 134 via Resistors 130 and 132 is a Capacitor 136 which can be a 0.047 microfarad Capacitor. The Variable Resistor 134 then connects to two Resistors, 138 and 140. Resistor 138 can be 68 Ohms and Resistor 40 can be 2.2 Kilohms. Resistor 140 leads to ground. Resistor 138 is wired to pins 2 and 6 of Amplifier 122. Pin 4 of Amplifier 122 is connected to the minus 12 volt power supply and is also connected to ground via Capacitor 142 which can be 0.01 microfarads. Pins 1, 8 and 7 of Amplifier 122 are wired together via variable Resistor 144 which can have a value of 20 Kilohms. Pin 7 of the Amplifier 122 also is connected to the plus 12 volt power supply and also is grounded via Capacitor 146 which can be 0.01 micofarad Capacitor. The Capacitors used herein are bypass Capacitors which are designed to prevent oscillation from the power supply adding noise to the equipment. The signal or current flows through Resistor 124 and is modified by Capacitors 126, 128 and 136 and also by Resistors 130, 132 and 134 so that the 60 cycle power line frequency enters the entire network in equal but out of phase intensities, which cancel the 60 cycle noise. What is left to enter the Amplifier 122 is all signals other than 60 cycles. The Amplifier 122 is a unity gain amplifier which passes all other frequencies while cancelling the 60 cycle mode. The Notch as described will cancel out unwanted 60 cycle signals (50 cycle in European power supplies) to thereby permit the measurement of signals of interest. Resistor 134 is varied in order to tune the filter to reject 60 cycles. The variable Resistor 144 is for nulling out the input offset. This Notch filter and other notch filters discussed for the present invention must be very low noise operational amplifiers such as OPO7 made by Intersil.

The low pass circuit is shown in FIG. 7. This circuit includes three 60 Hertz Notch Filter 120 as previously described. The input signal comes from the Switch 56 input jack 54. Alternatively, the signal can travel from coil wires 58 and 60 into input jack 54, routed to switch 56 and then back to the jack 54. Jack 54 connects into a chopper stabilized very low noise high impedance Amplifier 150 which has 14 pins of which 9 pins are used. The jack 54 is connected via pin 5. Pins 4 and 9 are jumpered together and connected to ground via Resistor 152 which can be a 10 Kilohm Resistor. The top end of Resistor 152 connects to Variable Resistor 154 which can be a 1 Megaohm gain setting Resistor which then connects to output pin 10. Pins 1, 8 and 2 are connected by two Capacitors 156 and 158 which can be 0.1 microfarad Capacitors. Pin 11 is connected to the plus 8.2 volt power supplied from the switch and has a bypass Capacitor 160 which can be a 3.3 microfarad Capacitor. Pin 7 is connected to the minus 8.2 volt power supplied from the switch and has a bypass Capacitor 162 to ground. Capacitor 162 can be 3.3 microfarads. The amplifier 150 can be an Intersil 7652. Once through this Amplifier, the signal has been detected and amplified and is dominated by 60 Hertz.

Figure 6:
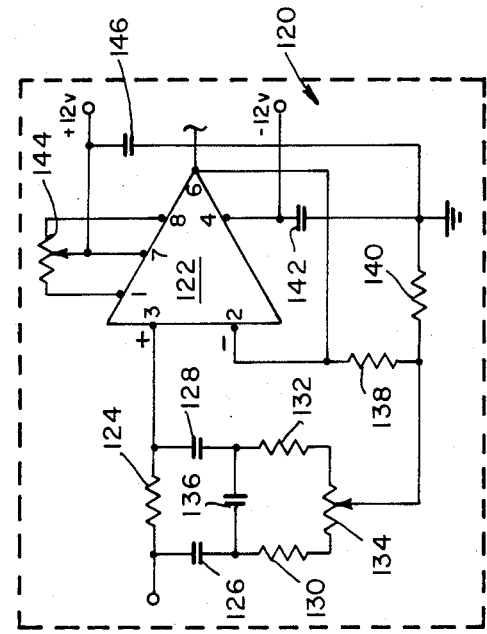
FIG. 6 is a circuit diagram of a 50 to 60 Hertz tunable notch filter.

The signal leaves output pin 10 and travels into the first 60 Hertz Notch Filter 120 which serves to cancel out the 60 Hertz dominant wave. The Signal leaves Notch Filter 120 from pin 6 (see FIG. 6) and enters Resistor 164 which can be a 500 Kilohm Resistor. The Signal then travels to Resistor 166 which can also be a 500 Kiloohm Resistor and from there into Amplifier 170 which can be an Precision Monolitic OPO7. This Amplifier has 8 pins of which 5 are used. The Signal also travels through Capacitor 168 which can be a 0.1 Microfarad Capacitor and then to ground. The combination of Resistors 164 and 166 and Capacitor 168 acts as a low pass filter with a cutoff frequency of approximately 64 Hertz. This serves to smooth down more of the power line related harmonmics. The Signal enters Amplifier 170 via Pin 2. Pin 3 is connected to ground via Resistor 172 which can be 1 Megaohm. Pin 4 is connected to the minus 12 volt power supply switch and also connected to ground via bypass Capacitor 174 which can be a 0.01 Microfarad Capacitor. Pin 7 is connected to the plus 12 volt power supply switch and also connected to ground via Bypass Capacitor 176 which can be a 0.01 microfarad Capacitor. Pin 2 and output pin 6 are wired together by Resistor 178 and Capacitor 180 which are connected in parallel. Resistor 178 can be a 10 Megaohm Resistor and Capacitor 180 can be a 0.022 microfarad Capacitor. After the signal has gone through this feedback network, the very low frequencies from 0.01 Hertz to 1 Hertz have been boosted.

The signal then travels into another 60 notch filter 120 to further eliminate other additional 60 Hertz components which have remained. The signal then travels to a current mirror transconductance Amplifier 190 such as an RCA CA3080. This Amplifier 190 has 8 pins of which all 8 are used. The Signal enters Amplifier 190 via pin 3. Pins 1 and 8 are connected via Capacitor 192 which can be a 0.005 Microfarad Capacitor. Pin 2 is connected to ground via Resistor 194 which can be 56 Ohms. Pin 4 is connected to the minus 12 volt supplied switch and is also routed to ground via Capacitor 196 which can be a 0.01 Microfarad Capacitor. Output Pin 6 is connected to Pin 2 to form a feedback gain network via Resistor 198 and Capacitor 200 which are connected -continued

| Component | Number | Value |
|---|---|---|
| 2. Capacitor | 366 | 0.01 Microfarads |
| 3. Capacitor | 368 | 0.01 Microfarads |
| 4. Capacitor | 370 | 0.01 Microfarads |
| 5. Resistor | 372 | 2.2 Kilohms |
| 6. Resistor | 374 | 51.2 Kilohms |
| 7. Variable Resistor | 376 | 10 Kilohms |
| 8. Low Noise High Speed Amplifier | 378 | LT1037 - Linear Tech. |
| 9. Resistor | 380 | 68 Ohms |
| 10. Resistor | 382 | 2.2 Kilohms |
| 11. Bypass Capacitor | 384 | 0.01 Microfarad |
| 12. Bypass Capacitor | 386 | 0.01 Microfarad |
| Plus 12 volts power switch into Pin 7 | | |
| Minus 12 volts power switch into Pin 4 | | |

For the 300 Hertz Notch Filter 392, the components and values are as follows:

| Component | Number | Value |
|---|---|---|
| 1. Resistor | 394 | 696 Kilohms |
| 2. Capacitor | 396 | 0.01 Microfarads |
| 3. Capacitor | 398 | 0.01 Microfarads |
| 4. Capacitor | 400 | 0.01 Microfarads |
| 5. Resistor | 402 | 6.49 Kilohms |
| 6. Resistor | 404 | 68 Kilohms |
| 7. Variable Resistor | 496 | 20 Kilohms |
| 8. Low Noise High Speed Amplifier | 408 | LT1037 - Linear Tech. |
| 9. Resistor | 410 | 68 Ohms |
| 10. Resistor | 412 | 2.2 Kilohms |
| 11. Bypass Capacitor | 414 | 0.01 Microfarad |
| 12. Bypass Capacitor | 416 | 0.01 Microfarad |
| Plus 12 volts power switch into Pin 7 | | |
| Minus 12 volts power switch into Pin 4 | | |

Figure 8:
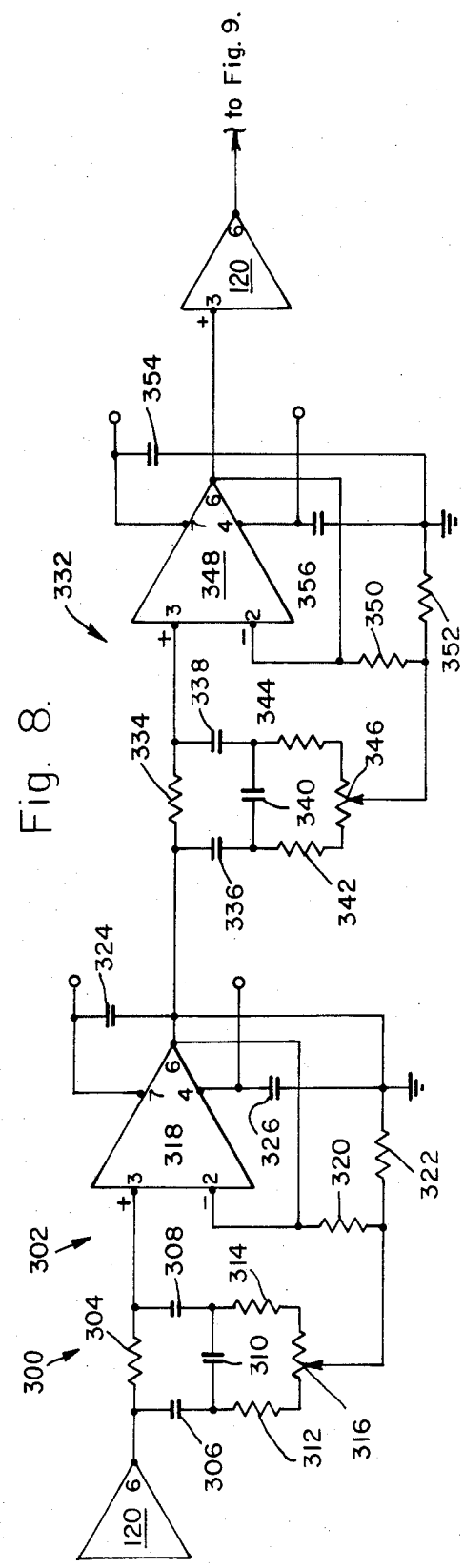
FIG. 8 is a schematic diagram of the first portion of the Master Notching Network For The High Pass Circuit.

For the High Pass Circuit 30, the Signal first travels into the notching group as shown in FIG. 8, first into a 60 Hertz Notch Filter 120 where the 60 Hertz component is first attenuated. From there, the Signal travels into the 180 Hertz Notch Filter 302 where the 180 Hertz component is attentuated. From there, the Signal travels into the 120 Hertz Notch Filter 332 where the 120 Hertz component is attentuated. Thereafter, the Signal travels through a second 60 Hertz Notch Filter 120 where the 60 Hertz Component is further attenuated. The Signal then travels into the 420 Hertz Notch Filter 378 where the 420 Hertz component is attenuated. Thereafter, the Signal travels through a third 60 Hertz Notch Filter 120 where the 60 Hertz Component is further attenuated. The Signal then travels into the 300 Hertz Notch Filter 392 where the 300 Hertz component is attenuated. Finally, the Signal then travels into a fourth 60 Hertz Notch Filter where the 60 Hertz Component is attenuated even further.

In the Low Pass circuit the 60 Hertz Notch Filters are always operative. In the High Pass Circuit, the 60 Hertz Notches Filters are only energized when it is desired to look at very low frequencies. The High Pass Circuit is shown in FIG. 10. In the normally opened position when the Notch Filters are not energized, current travels from the Switch position shown in FIG. 3 into the first Amplifier which can be an LT 1037 model low noise high speed amplifier. Current enters the Amplifier 420 through Pin 3. Current is also routed to an equalizing network which is comprised of Capacitors 422 and 424 and Resistors 426 and 428 and finally through Capacitor 430 to ground. Capacitor 422 can be a 1 Microfarad Capacitor and Capacitor 424 can one of several values ranging form 0.001 to 0.004 Microfarads. Resistors 426 and 428 can each be 10 Kilohms. Capacitor 430 can be a 10 Microfarad Capacitor. Current flows through Capacitor 422 to Resistor 428 where the current is split, part of it running through Resistor 426 and Capacitor 424 and through Capacitor 430 to ground while a portion of the current goes directly through Capacitor 430 to ground. This is a balancing equalizing network which linearizes the input from the coil or antenna and makes the correct matching impedance to mate with the Amplifier 420. Pin 4 of Amplifier 420 receives a minus 12 Volts from the input switch and current is also routed from Pin 4 through Bypass Capacitor 432 which can be 0.01 Microfarads to ground. Pin 7 of Amplifier 420 receives plus 12 Volts and current is then routed through Bypass Capacitor 434 to ground. Pins 1 and 8 are connected to a multiturn potentiometer 436 where an input offset can be nulled out. A Gain Setting Network or Attenuation Scales for the High Pass Circuit is shown generally at 440. Pin 2 and Output Pin 6 are connected such that current flows through Variable Resistor 442 which can be 1 Megaohm and then through Resistor 444 which can be 10,000 Ohms. With this configuration, maximum gain of the Amplifier 420 is 100. The Gain Setting Network 440 has 6 contact points numbered 1 through 6 as shown. In Positions 1, 2, 3 and 4, the gain is set at 10 microgauss. In Position 5, the Gain is set at 100 microgauss. In Position 5, a Resistor which can be 100 Kilohms is placed. In Position 6, the Gain is set at 1000 Microgauss. The gain setting just described is set by adjusting Variable Resistor 448 which can be 100 Kilohms. These values are selected by adjusting both Resistors 442 and 448.

From Gain Setting Network 440, the Current then flows into Relay 450. This is shown in the normally closed position so that in the nonenergized position, current then flows through relay 450 into Amplifier 452 which can be an LT 1037. This is an eight pin amplifier where 5 pins are used. Current flows into pin 3. Minus 12 volts from the input switch flow into Pin 4 and is also routed through Bypass Capacitor to ground. Plus 12 volts from the input switch flows into Pin 7 and current is also routed through Bypass Capaciter 456 to ground. Both Capacitors 454 and 456 can be 0.01 Microfarads. Pin 2 and Output Pin 6 are connected together through two Resistors, a fixed Resistor 458 which can be 10 Kilohms and a Variable Resistors 460 which can be 1 Megaohm. The Variable Resistor 460 is used to set the output gain of Amplifier 452. The current then flows to Relay 462 which is shown in the normally closed position. Current then flows to the output switch.

When the Relay 450 is energized, the contact points 451 are opened and contact points 453 are closed. Current will flow as just described but in addition, the current flow from the Master Notching Network 300 in FIGS. 8 and 9 will also be added into the circuit. Current flows into the Notch Network 409 through contact point 453a and flows from the Notch Network 300 into the circuit via contact point 453b. When it is desired to read the ELF frequencies, the Notch Network 300 is included. When it is desired to read the VLF frequencies, the Notch Network 300 is excluded.

Output loading Resistor 464 is connected to ground. This can be 10 Kilohms. When Relay 462 is in the normally closed position as shown, the current flows through portion 466 to the output connector. When Relay 462 is energized, contact points 463 are opened and contact points 468 are closed. In this position the Automatic Level Control 470 (to be described) is brought into the circuit.

Figure 11:
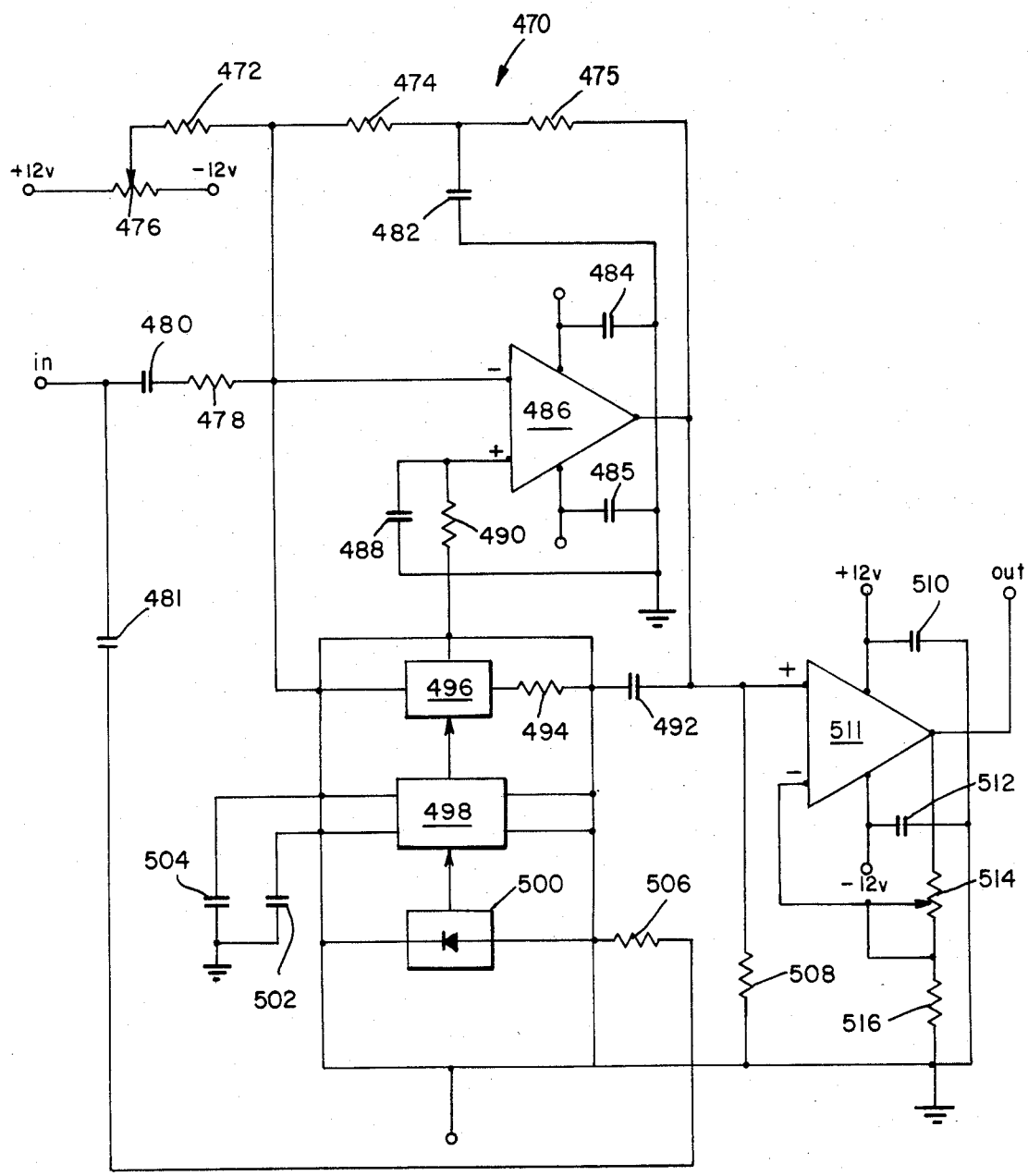
FIG. 11 is a schematic diagram of the Automatic Level Control.

The Automatic Level Control 470 circuit shown in FIG. 11 is a standard circuit which for example is described in the 1983 Signetics Analog Data Manual on page 5-22 and described therein as a Programmable Analog Compandor—NE 572. The operation is described beginning on page 5-3 et seq. The parts and values therefore will be briefly described in the following table.

| Component | Number | Value |
|---|---|---|
| 1. Resistor | 472 | 2.2 Kilohms |
| 2. Resistor | 474 | 10 Kilohms |
| 3. Resistor | 475 | 10 Kilohm |
| 4. Variable Resistor | 476 | 500 Kilohms |
| 5. Resistor | 478 | 17.2 Kilohms |
| 6. Capacitor | 480 | 2.2 Microfarads |
| 7. Capacitor | 481 | 2.2 Microfarads |
| 8. Capacitors | 482 | 10 Microfarads |
| 9. Bypass Capacitor | 484 | 0.01 Microfarads |
| 10. Bypass Capacitor | 485 | 0.01 Microfarads |
| 11. Amplifier | 486 | LT 1037 |
| 12. Capacitor | 488 | 2.2 Microfarads |
| 13. Resistor | 490 | 1 Kilohm |
| 14. Capacitor | 492 | 2.2 Microfarads |
| 15. Resistor | 494 | Amplifier Component |
| 16. Gain Cell | 496 | Amplifier Component |
| 17. Buffer | 498 | Amplifier Component |
| 18. Rectifier | 500 | Amplifier Component |
| 19. Capacitor | 502 | 4.7 Microfarad |
| 20. Capacitor | 504 | 0.1 Microfarad |
| 21. Resistor | 506 | 3.3 Kilohms |
| 22. Resistor | 508 | 100 Kilohms |
| 23. Bypass Capacitor | 510 | 0.01 Microfarads |
| 24. Bypass Capacitor | 512 | 0.01 Microfarads |
| 25. Variable Resistor | 514 | 500 Kilohms |
| 26. Resistor | 516 | 47 Kilohms |

The Automatic Level Control 470 makes all of the components equivalent in amplitude for separating the spectral components of each frequency band being measured. This is done by making all of them equivalent in level. It is switched into and out of the circuit via Relay 462 as previously described and can be inserted into the circuit by a push button switch.

Figure 12:
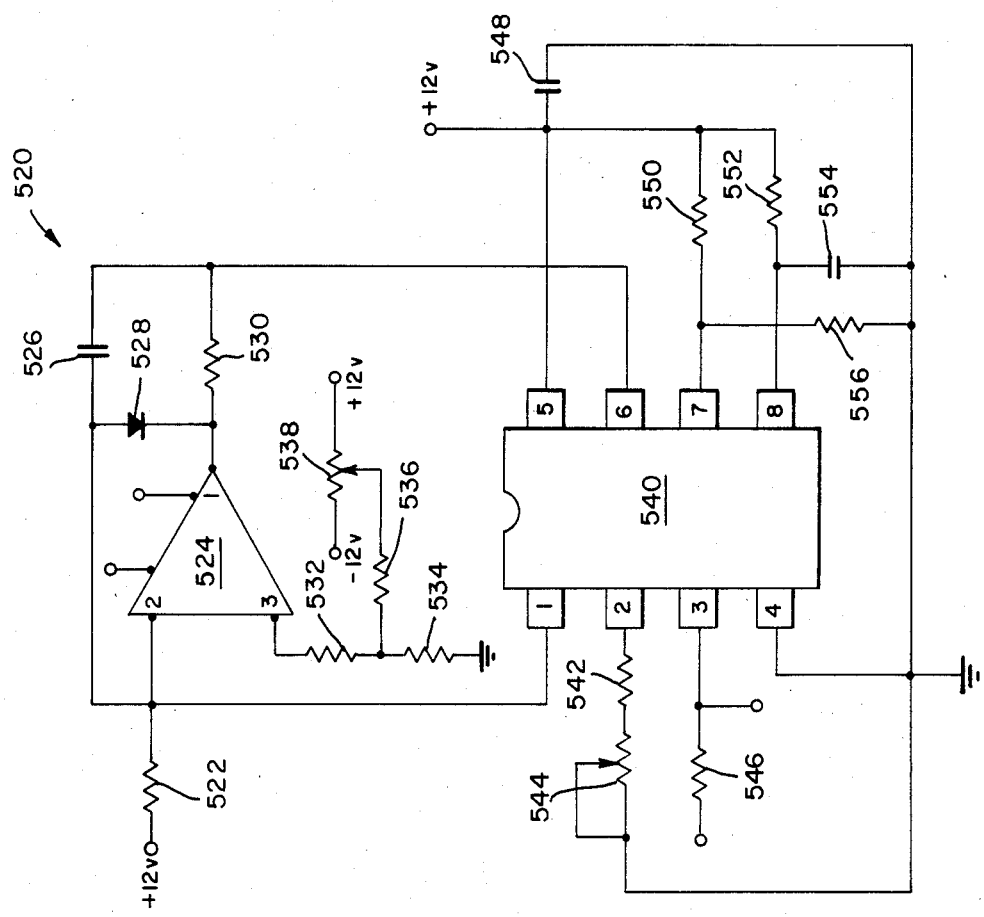
FIG. 12 is a schematic diagram of the Voltage To Frequency Converter.

FIG. 12 discloses a standard Precision Voltage-to-Frequency Converter 520 as described in EXAR Integrated Systems, Inc. XR-4151 Specification Sheet, Rev 1, 11/79, FIG. 4. The components are as follows:

| Component | Number | Value |
|---|---|---|
| 1. Resistor | 522 | 100 Kilohms |
| 2. Amplifier | 524 | XR4558 - One-Half Used |
| 3. Capacitor | 526 | 0.005 Microfarad |
| 4. Diode | 528 | 1N910 |
| 5. Resistor | 530 | 100 Ohm |
| 6. Resistor | 532 | 100 Kilohms |
| 7. Resistor | 534 | 100 Ohms |
| 8. Resistor | 536 | 100 Kilohms |
| 9. Variable Resistor | 538 | 25 Kilohms |
| 10. Chip | 540 | XR4151 |
| 11. Resistor | 542 | 12 Kilohms |
| 12. Variable Resistor | 544 | 5 Kilohms |
| 13. Resistor | 546 | 5.1 Kilohms |
| 14. Bypass Capacitor | 548 | 0.1 Microfarad |
| 15. Resistor | 550 | 5.1 Kilohms |
| 16. Resistor | 552 | 6.8 Kilohms |
| 17. Capacitor | 554 | 0.01 Microfarads |
| 18. Resistor | 556 | 10 Kilohms |

This Voltage to Frequency Converter 520 allows the acquisiton of the processed signals to be fed to an ordinary tape recorder for later analysis.

Figure 13:
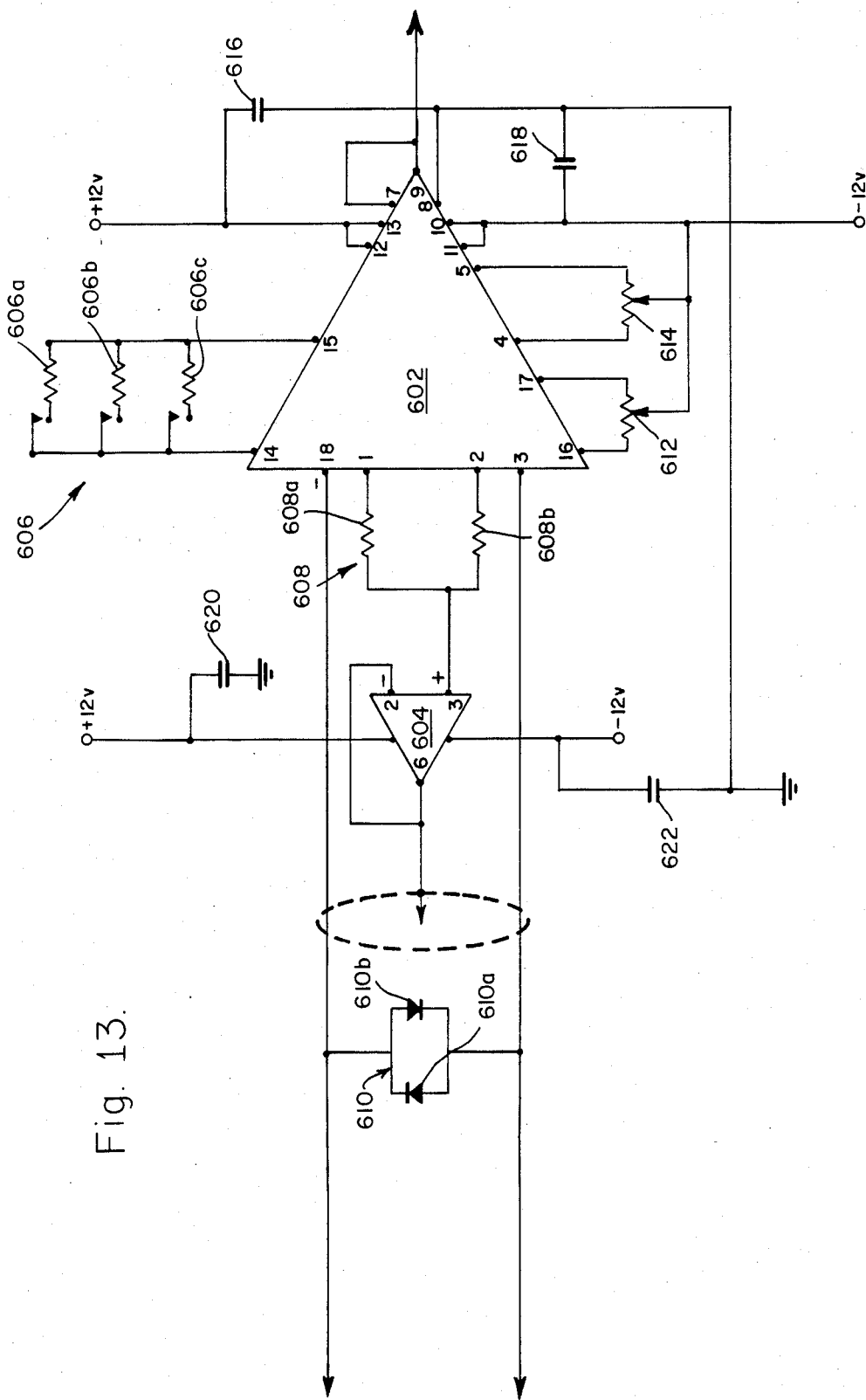
FIG. 13 is a schematic diagram of an alternate Input Amplifier for double ended operation and gain setting network for use with the Low Pass Circuit.

FIG. 13 is a schematic diagram of an alternate double ended input amplifier which could be used in place of Amplifier 150 in the Low Pass Circuit as shown in FIG. 7. This is a low noise amplifier with approximately 10 to 11th Ohms input impedance which drives a signal into the coil container 44 and serves to act as a notch filter without loading the circuit. This can operate on plus and minus 12 volts whereas Amplifier 150 operates on 8.2 volts. So the signal swing is substantially enhanced. The amplifier 150 is better for measuring high intensity fields but this double ended Amplifier is better in situations where the signal swing is more important.

FIG. 13 illustrates a schematic diagram of the alternate input amplifier and gain setting network for the low pass input amplifier 150 previously described. The circuit 600 consists of a Double Ended Input Instrumentation Amplifier 602 which can be a Precision Monolithics Incorporated AMP01 which has 18 pins of which all are used. Circuit 600 also comprises drive amplifier 604 which can be a Precision Monolithics Inc. OP07. Circuit 600 also contains Gain Setting Switching Network 606 and Fixed Gain Setting Network 608. There is also a Back To Back Diode Network 610 which serves as input overload protection from large incoming surge signals. The Instrumentation Amplifier 602 also contains variable Resistor 612 which must be 100 Kilohms and is an input offset adjustment. Variable Resistor 614 is an output offset adjustment and must also have a value of 100 Kilohms. Plus 12 volts enters the Amplifier 602 through Pin 13 and Minus 12 volts enters the Amplifier 602 through Pin 10. Capacitor 616 can be 1 Microfarad and is a balancing by-pass Capacitor. Capacitor 618 can also be 1 Microfarad and is also part of the balancing by-pass network. Plus 12 volts enters Pin 7 of Amplifier 604 and Minus 12 volts enters Amplifier 604 through Pin 4. Capacitors 620 and 622 are each Bypass Capacitors which can be 0.01 Microfarads and each goes to ground. Switching Network or Attenuation Network or Scales 606 is a single pole 3 position rotary switch which includes 3 Resistors. Resistor 606a can be 10 Kilohms, Resistor 606b can be 100 Kilohms, and Resistor 606c can be 1 Megaohms. This network connects to Pins 14 and 15 of Amplifier 602. Input Gain Setting Network comprises two identical Resistors 608a and 608b which can each be 1 Kilohm. This network connects to Pins 1 and 2 of Amplifier 602 and Pin 3 of Amplifier 604. Also included in the circuit is a Surge Protection Network 610 which includes two identical iodes 610a and 610b which can be 1N-914.

In operation, the Signal from the Coil 12 passes through Surge Protection Network 610 and then into Amplifier 602 via Pins 3 and 18. The Signal then passes through the Input Gain Setting Network 608 and then into Amplifier 604 via Pin 3. Amplifier 604 samples the incoming Signal and then serves to drive it back down the shield of the Coil 12 in order to cancel large component power line noise. Depending on the getting of Network 606, the Signal is amplified and then leaves Pin 9 into 60 Hertz Notch Filter 120 of the Low Pass Circuit. The Coil as drawn in FIG. 2 as shown is for single ended operation only. When the circuit of FIG. 13 is used, then lead wire 48 is disconnected from the shield 52.

The present invention been described in great detail in order to comply with the patent laws to enable one skilled in the art to make the invention. However, the invention can be described in broader terms and this will be done through a demonstration of the invention in operation. For example, let us say we will utilize the present invention 10 to detect an earthquake which has created certain very minute magnetic and electromagnetic impulses or disturbances in the earth's atmosphere. First, the magnetic disturbance will be detected through use of Coil Means such as the coil 12 illustrated in FIG. 2 and previously described. One variation of this embodiment within the spirit and scope of the present invention is to utilize three coils means 12 orthoganally oriented for multidirectional purposes. The Coil Means could also include a spherically wound coil on a gimbal with a rotating mumetal shutter for directionalizing. The coil Means detects the very minute magnetic disturbance which generates a signal within the coil windings by the means and scientific principles previously discussed. This signal generated within the coil windings is then transmitted to the Input/Output Switching Means such as the switching means 16 previously discussed. The Input/Output Switching Means is also connected to a Direct Current Power Supply Means 18. The Power Supply Means 18 and Input/Output Switching Means 16 are interconnected such that the Input/Output Switching Means 16 can tap both plus and minus 12 volts and plus and minus 8.2 volts from the Power Supply Means 18 by methods previously discussed. The Input/Output Switching Means is also capable of directing the Signal to either or both the Low Pass Circuit Means 22 or the High Pass Circuit Means 30. When it is desired to measure only Magnetic impulses, the Signal is routed by said Input/Output Switching Means to the Low Pass Circuit Means 22 which serves to filter out unwanted noise by the methods previously discussed and permits the measurement of very minute Magnetic Fluctuations down to 0.1 Hertz and to 500 Hertz on the high end. For purposes of measuring outside this range, the Signal is routed to said High Pass Circuit Means 30 which can measure the magnetic fluctuations down to 0.01 Hertz and up to 50 Kilohertz. After passing through said Low Pass Electronics Means 22, said Signal is transmitted to Attenuation Scale Means such as previously described in FIG. 12. Said Attenuation Scale Means 24 provides accurate decade calibrations for said Signal Means. From said Attenuation Scale Means 24, said Signal is routed to said Output Switching Means 26 such as that previously described in FIGS. 3 and 4 which is a portion of the Input/Output Switching Means 16. From the Output Switching Means 26, said Signal is transmitted to said Voltage Frequency Converter Means such as that previously described in FIG. 12 as number 520. Said Voltage Frequency Converter Means converts said Signal current to a frequency and permits reading from Frequency Reading Means such as an ordinary tape recorder from which information can be read into a device such as a spectrum analyzer, chart recorder, oscilloscope or computer. Alternatively, said Signal can be transmitted from said Output Switching Means 26 to a Current Readings Means such as an analog meter or digital meter. Specific signatures are read by either the Current Reading Means or Frequency Reading Means and are compared to previously known signatures in order to determine what the reading tells the analyzer. A comparison to previously known signatures enables the analyzer to determine that the magnetic impulse being read is the same as that for a particular energy input such as an earthquake. Directionalizing said Coil Means 12 enables the analyzer to determine the direction from which the Signals emanate. When routed through said High Pass Circuit Means such as number 30, the Signal also travels again to an Attentuated Scales Means 32 with the same result as previously described and also to said Output Switches 26 and to reading means as just discussed. As previously discussed in the high pass circuit of FIGS. 8 and 9, a portion of the Signal is transmitted through a High Pass Equalizer Network Means which creates an impedance match of the input device which in this case is the coil. In addition, a portion of the Signal from said High Pass Circuit Means 30 travels to Auto Level Means such as that described in FIG. 10 as number 470. Said Auto Level Means serves to levelize all incoming signals for the purpose of better resolution of the overall signals. The Signal then travels to said Output Switching 26 and through the remaining components as previously discussed. When routed through said High Pass Circuit Means the same readout means are used but a much high range of frequencies is read as just discussed. Therefore, the technique is to first route the Signal through said Low Pass Circuit Means to obtain all data with a limited range and thereafter route said Signal through said High Pass Circuit Means to completely measure all other frequencies in the broader range. The tradeoff is that the High Pass Circuit Means 30 does not have the same degree of sensitiviety as the Low Pass Circuit Means. That is why both sets of circuits are needed for a completely accurate analysis.

In addition to said Coil Means 12, the electromagnetic disturbance will be detected through use of Loop Means or E-Field Antenna means such as previously described. The Electromagnetic Disturbance generates a Signal within said Loop or E-Field Antenna Means by the means and scientific principles previously discussed. This signal generated within the loop or antenna is then transmitted to the Input/Output Switching Means such as the swtiching means 16 previously discussed. The Input/Output Switching Means is also connected to a Direct Current Power Supply Means 18. The Power Supply Means 18 and Input/Output Switching Means 16 are interconnected such that the Input/Output Switching Means 16 can tap both plus and minus 12 volts and plus and minus 8.2 volts from the Power Supply Means 18 by methods previously discussed. For use with Electromagnetic Signals, the Input/Output Switching Means 16 directs the signal only to said High Pass Circuit 30. The range of frequencies measured is from 1 Kilohertz to 1 Megahertz. When routed through said High Pass Circuit Means such as number 30, the Signal also travels again to an Attenuated Scales Means 32 with the same result as previously described and also to said Output Switches 26 and to reading means as previously discussed. As previously discussed in the high pass circuit of FIGS. 8 and 9, a portion of the Signal is transmitted through a High Pass Equalizer Network Means which creates an impedance match of the input device which in this case is the Loop or E-Field Antenna Means. The Loop or E-Field Antenna Means is calibrated to match the input electronics of the High Pass Circuit Means 30. In addition, a portion of the Signal from said High Pass Circuit Means 30 travels to Auto Level Means such as that described in FIG. 10 as number 470. Said Auto Level Means serves to levelize all incomming signals for the purpose of better resolution of the overal signals. The Signal then travels said Output Switching and through the remaining components as previously discussed. The purpose of this second reading means (Loop or E-Field Antenna Means) is to be able to find certain magnetic fields which do not have have purely magnetic components and have components such as electromagnetic components or electric fields. A volcanic eruption is one type of disturbance which would fall into this category. That is why it is necessary to have this second reading means in order to diversifiy the types of disturbances which can be read by the present invention. Also, certain disturbances which have all components can be better read with the Loop or E-Field Antenna Means. For example a lightning storm can be read by both but the Loop or E-Field Antenna Means permits far more accurate reading and also permits directionalize and frequency resolution of the disturbance.

Although the present invention has been described with both a Loop and E-Field Means and also with Coil Means, it is possible to use a device with either of the inout means but this would limit the device to the specific things which can be read as just discussed.

Of course the present invention is not intended to restricted to any particular form or arrangement or any specific embodiment disclosed herein, or any specific use, since the same may be modified in various particulars or relations without departing from the spirit or scope of the claimed invention hereinabove shown and described of which the apparatus shown is intended only for illustration and for disclosure of any operative embodiment and not to show all of the various forms of modification in which the invention might be embodied.

The invention has been described in considerable detail in order to comply with the patent laws by providing a full public disclosure of at least one of its forms. However, such detailed description is not intended in any way to limit the broad features or principles of the invention, or the scope of patent monopoly to be granted.

What is claimed is:

1. Apparatus for detecting the frequencies, intensities, and wave forms of magnetic and electromagnetic fields, comprising:

a. a first magnetic field frequency, intensity and wave form receiving means;
b. an input-output switching means;
c. the first magnetic field frequency, intensity and wave form receiving means connected to said input-output switching means;
d. an output switching means;
e. a low pass circuit comprising low pass electronics and filtering means and first attenuator scale means;
f. said first magnetic field frequency, intensity and wave form receiving means comprising a coil composed of a central coil winding wound around a non-conducting form containing a mumetal core therein, with the winding and core fully enclosed within a container made of conductive material which provides an electric field shield and including an opening to permit the leads from the winding to be connected to the input-output switching means with the leads being enclosed in a shield along the path from the container to the input-output switching means;
g. said input-output switching means also connected to a power supply means;
h. said input-output switching means also connected to said low pass electronics and filtering means;
i. said low pass electronics and filtering means connected to said first attenuator scale means;
j. said first attenuator scale means connected to a first variable resistor;
k. said first variable resistor connector to said output switching means;
l. said output switching means connected to a signal reading means;
m. a second electromagnetic field frequency, intensity and wave form receiving means;
n. said second electromagnetic field frequency, intensity and wave form receiving means comprising an antenna connected to said input-output switching means;
o. a high pass circuit comprising high pass input equalizer network means, high pass electronics and filtering means, and second attenuator scale means;
p. said input-output switching means also connected to both said high pass input equalizer network means, and said high pass electronics and filtering means;
q. said high pass electronics and filtering means connected to said second attenuator scale means;
r. said second attenuator scale means connected to a second variable resistor;
s. said second variable resistor connected to said output switching network means;
t. said input-output switching means further comprising means to route the signal received from said coil to either said low pass circuit or said high pass circuit, means to route the signal received from said antenna to said high pass circuit, and means to route the signal from the coil and the antenna simultaneously through the low pass circuit and high pass circuit respectively;
u. first, second and third notch filter means for filtering out selected frequencies;
v. said low pass electronics and filtering means further comprising:
 (i) a very low noise very high input impedance amplifier connected to said input-output switching means;
 (ii) said first notch filter means connected to said very low noise very high input impedance amplifier;
 (iii) said first notch filter means connected to a low frequency boost integrating amplifier circuit comprised of a Tee low pass network with a selected cutoff frequency, connected to an amplifier which amplifier is in turn connected to a power source and to an integrating feedback network composed of a resistor and capacitor in parallel with said amplifier which circuit serves to boost low frequencies which are in the range of 0.01 Hertz to 1 Hertz;
 (iv) the amplifier to said low frequency boost integrating amplifier circuit connected to said second notch filter means;
 (v) said second notch filter means connected to a current mirror transconductance amplifier circuit which serves to convert a voltage to a current and to further equalize the very low frequency components of the signal while at the same time reducing the voltage noise figure contributed by the other amplifiers;
 (vi) the amplifier of said current mirror transconductance amplifier circuit connected to a very high input impedance unity gain amplifier;
 (vii) said very high input impedance unity gain amplifier connected to said third notch filter means; p1
 (viii) said third notch filter means connected to a power amplifier;
w. said low pass electronics and filtering means connected to attenuator scale means which serves to select the intensity of the signal being received;

x. a multiplicity of notch filter circuits connected in series for removing unwanted powerline fundamental frequency and harmonics;

y. relay means to connect or disconnect said multiplicity of notch filter circuits to said high pass electronics and filtering means;

z. said high pass electronics and filtering means further comprising:
  (i) an input amplifier for receiving the signal;
  (ii) said input amplifier connected to a gain setting network means which serves to select the intensity of the signal being received;
  (iii) the gain setting network means connected to an output amplifier in the high pass electronics and filtering means, which output amplifier can be adjusted to set the output gain of the output amplifier; and aa. said high pass input equalizer network comprising a balancing equalizing network connected to the input amplifier of said high pass electronics and filtering means, which is always operative at the same time as the input amplifier of the high pass electronics and filtering means, for linearizing the input from said coil or said antenna and making the correct matching impedance to mate with the input amplifier;

bb. whereby when a frequency, intensity and wave form signal from a magnetic field is received by said coil or when a frequency, intensity and wave form signal from an electromagnetic field is received by said antenna, the signal is transmitted by the coil or antenna to said input-output switching means which is adjusted to allow the frequency, intensity and wave form from the magnetic field detected by the coil to travel through the low pass circuit or the high pass circuit or to allow the frequency, intensity and wave form from the electromagnetic field to travel through the high pass circuit, wherein the low pass circuit when receiving an input signal from the coil can detect magnetic frequencies in the range from approximately 0.1 Hertz to 500 Hertz and is sensitive down to 0.1 nano-Gauss and the high pass circuit when receiving an input signal from the coil can detect frequencies in the range from 0.1 Hertz to 50 Kilohertz and is sensitive down to 0.1 microgauss and the high pass circuit when receiving a signal from the antenna can detect electromagnetic frequencies in the range from approximately 1 kilohertz to 1 megahertz, and wherein said multiplicity of notch filters are actuated into the circuit when it is desired to measure frequencies below 300 Hertz in the high pass circuit.

2. The apparatus according to claim 1, wherein said high pass circuit further comprises an automatic level control circuit located between the output of the high pass electronics and filtering means and said output switching means, wherein the automatic level control circuit levels all signals output from said high pass electronics circuit and filtering means to convert the signals to ones of equal amplitude.

3. The apparatus as defined in claim 1 further comprising a voltage to frequency converter and means for recording and displaying the output of said converter.

4. The apparatus according to claim 1 wherein said coil further comprises about 17.5 kilometers of number 44 American wire gauge.

5. The apparatus as defined in claim 1 wherein said coil is a three axis coil.

6. The apparatus as defined in claim 1 wherein the very low noise amplifier of the low pass electronics and filtering means is a double ended amplifier.

7. Apparatus for detecting the frequencies, intensities, and wave forms of magnetic fields, comprising:

a. a magnetic field frequency, intensity and wave form receiving means;

b. an output switching means;

c. a low pass circuit comprising low pass electronics and filtering means and attenuator scale means;

d. said magnetic field frequency, intensity and wave form receiving means comprising a coil composed of a central coil winding wound around a non-conducting form containing a mumetal core therein, with the winding and core fully enclosed within a container made of conductive material which provides an electric field shield and including an opening to permit the leads from the winding to be connected to the low pass electronics and filtering means with the leads being enclosed in a shield along the path from the container to the input portion of an input-output switching means;

e. said low pass electronics and filtering means connected to a power supply means;

f. said low pass electronics and filtering means connected to said attenuator scale means;

g. said attenuator scale means connected to a variable resistor;

h. said variable resistor connector to said output switching means;

i. said output switching means connected to a signal reading means;

j. first, second and third notch filter means for filtering out selected frequencies;

k. said low pass electronics and filtering means further comprising:
  (i) a very low noise very high input impedance amplifier connected to the output portion of said input-output switching means;
  (ii) said first notch filter means connected to said very low noise very high input impedance amplifier;
  (iii) said first notch filter means connected to a low frequency boost integrating amplifier circuit comprised of a Tee low pass network with a selected cutoff frequency, connected to an amplifier which amplifier is in turn connected to a power source and to an integrating feedback network composed of a resistor and capacitor in parallel with said amplifier which circuit serves to boost low frequencies which are in the range of 0.01 Hertz to 1 Hertz,
  (iv) the amplifier to said low frequency boost integrating amplifier circuit connected to said second notch filter means;
  (v) said second notch filter means connected to a current mirror transconductance amplifier circuit which serves to convert a voltage to a current and to further equalize the very low frequency components of the signal while at the same time reducing the voltage noise figure contributed by the other amplifiers;
  (vi) the amplifier of said current mirror transconductance amplifier circuit connected to a very high input impedance unity gain amplifier;
  (vii) said very high input impedance unity gain amplifier connected to said third notch filter means;
  (viii) said third notch filter means connected to a power amplifier; and l. whereby when a frequency, intensity and wave form signal from a magnetic field is received by said coil, the signal is transmitted by the coil to said low pass circuit, wherein the low pass circuit when receiving an input signal from the coil can detect magnetic frequencies in the range from approximately 0.1 Hertz to 500 Hertz and is sensitive down to 0.1 nano-Gauss.

8. The apparatus as defined in claim 7 further comprising a voltage to frequency converter and means for recording and displaying the output of said converter.

9. The apparatus according to claim 7 wherein said coil further comprises about 17.5 kilometers of number 44 American gauge wire.

10. The apparatus as defined in claim 7 wherein said coil is a three axis coil.

11. The apparatus as defined in claim 7 wherein the very low noise amplifier of the low pass electronics and filtering means is a double ended amplifier.

12. Apparatus for detecting the frequencies, intensities, and wave forms of electromagnetic fields, comprising:

a. an electromagnetic field frequency, intensity and wave form receiving means;
b. an output means;
c. a high pass circuit comprising high pass input equalizer network means, high pass electronics and filtering means, and an attenuator scale means;
d. said electromagnetic field frequency, intensity and wave form receiving means comprising an antenna connected to said high pass circuit;
e. said high pass electronics and filtering means connected to said attenuator scale means;
f. said attenuator scale means connected to a variable resistor;
g. said variable resistor connected to said output means;
h. notch filter means for filtering out selected frequencies;
i. a multiplicity of notch filter circuits incorporating said notch filter means connected in series for removing unwanted powerline fundamental frequency and harmonics;
j. relay means to connect or disconnect said multiplicity of notch filter circuits to said high pass electronics and filtering means;
k. said high pass electronics and filtering means further comprising:
   (i) an input amplifier for receiving the signal;
   (ii) said input amplifier connected to a gain setting network means which serves to select the intensity of the signal being received;
   (iii) the gain setting network means connected to an output amplifier in the high pass electronics and filtering means, which output amplifier can be adjusted to set the output gain of the output amplifier; and
l. said high pass input equalizer network comprising a balancing equalizing network connected to the input amplifier of said high pass electronics and filtering means, which high pass input equalizer network is always operative at the same time as the input amplifier of the high pass electronics and filtering means, for linearizing the input from said antenna and making the correct matching impedance to mate with the input amplifier;
m. whereby when a frequency, intensity and wave form signal from an electromagnetic field is received by said antenna, the signal is transmitted by the antenna to said high pass circuit, wherein the high pass circuit when receiving a signal from the antenna can detect electromagnetic frequencies in the range from approximately 1 kilohertz to 1 megahertz, and wherein said multiplicity of notch filters are actuated into the circuit when it is desired to measure frequencies below 300 Hertz in the high pass circuit, and the circuit matches the input impedance of the antenna at all electromagnetic field frequencies detected and mirrors the linearity of the antenna.

* * * * *